(12) United States Patent
Anzou et al.

(10) Patent No.: US 7,254,762 B2
(45) Date of Patent: Aug. 7, 2007

(54) SEMICONDUCTOR INTEGRATED CIRCUIT

(75) Inventors: Kenichi Anzou, Kawasaki (JP); Chikako Tokunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 289 days.

(21) Appl. No.: 10/894,089

(22) Filed: Jul. 19, 2004

(65) Prior Publication Data
US 2005/0097418 A1   May 5, 2005

(30) Foreign Application Priority Data
Oct. 30, 2003   (JP)   ............ P2003-370947

(51) Int. Cl.
*G01R 31/28*   (2006.01)
(52) U.S. Cl. .................... 714/733; 714/718
(58) Field of Classification Search ......... 714/100–824
See application file for complete search history.

(56) References Cited

U.S. PATENT DOCUMENTS

| | | | |
|---|---|---|---|
| 6,088,823 A * | 7/2000 | Ayres et al. ............... | 714/733 |
| 6,362,015 B1 * | 3/2002 | Whetsel ...................... | 438/18 |
| 6,587,979 B1 * | 7/2003 | Kraus et al. ................ | 714/720 |
| 6,587,996 B1 * | 7/2003 | Reohr et al. ................ | 716/4 |
| 6,927,603 B2 * | 8/2005 | Yoshida ...................... | 326/93 |
| 6,966,021 B2 * | 11/2005 | Rajski et al. ............... | 714/726 |
| 7,103,814 B2 * | 9/2006 | Corbin et al. ............... | 714/726 |
| 2004/0083412 A1 * | 4/2004 | Corbin et al. ............... | 714/726 |

FOREIGN PATENT DOCUMENTS

| JP | 03-216900 | * | 9/1991 |
|---|---|---|---|
| JP | 11-016400 | * | 1/1999 |

* cited by examiner

*Primary Examiner*—Cynthia Britt
*Assistant Examiner*—Merant Guerrier
(74) *Attorney, Agent, or Firm*—DLA Piper US LLP

(57) ABSTRACT

A semiconductor integrated circuit includes: a logic circuit to be tested; a memory connected the logic circuit to be tested; a BIST circuit for testing the memory; and a bypass circuit connected between the memory and the logic circuit and between the memory and the BIST circuit, the bypass circuit has a parallel test path for testing the logic circuit and the memory in parallel, and a signal line test path for testing non-tested signal lines in the parallel test path, and the bypass circuit selectively switches the parallel test path and the signal line test path.

20 Claims, 15 Drawing Sheets

SEMICONDUCTOR INTEGRATED CIRCUIT

CROSS REFERENCE TO RELATED APPLICATIONS

This application is based upon and claims the benefit of priority from the prior Japanese Patent Applications No. P2003-370947, filed on Oct. 30, 2003; the entire contents of which are incorporated herein by reference.

BACKGROUND OF THE INVENTION

1. Field of the Invention

The present invention relates to a semiconductor integrated circuit, and, more particularly, relates to a semiconductor integrated circuit including a Buit-In Self Test (BIST) circuit.

2. Description of the Related Art

For a semiconductor integrated circuit with a built-in writable/readable memory, a method is known in which a fault is detected by testing the memory using a BIST circuit (memory BIST circuit). As shown in FIG. 14, a BIST circuit (memory BIST circuit) 30 generates memory write test data TD1, an address signal TA and a memory control signal TWEN, and sends this information to a memory 50. Memory read test data TQ1 is read out of the memory 50 in accordance with the memory write test data TD1, address signal TA and memory control signal TWEN. If the BIST circuit 30 is "comparator-based", the BIST circuit 30 compares the memory read test data TQ1 with an expected value generated in the BIST circuit 30 and determines whether or not the memory 50 is defective. Alternatively, if the BIST circuit 30 is "compactor-based", the BIST circuit 30 sequentially compacts the memory read test data TQ1, compares a final compacted result with an expected value which has been calculated beforehand, and determines whether or not the memory 50 is defective. Since the BIST circuit 30 is operated with only external clocks, it is possible to test the memory 50, without performing complicated controls.

Accordingly, it is easy to test the memory 50 by using the BIST circuit 30 in parallel with another test such as a test on a logic circuit 3.

For a test on the logic circuit 3, a scan test and a test using a logic BIST circuit are known. In the scan test, by using a scan design technique, a plurality of registers (flip-flops) in the logic circuit 3 are replaced by scan registers, and the scan registers are connected in series with each other, directly externally controlled, and observed. A test pattern can be made by regarding logic parts other than the registers in the logic circuit 3 as a combinational circuit, an output of which is uniquely determined by an input condition. On the other hand, the memory 50 connected with the logic circuit 3 sequentially operates and therefore cannot be regarded as a combinational circuit. Accordingly, the memory 50 is difficult to handle when making a test pattern.

Therefore, in general, as schematically shown in FIG. 14, a bypass circuit 40x is placed between the logic circuit 3 and the memory 50. The bypass circuit 40x propagates logic circuit test data D1 to D3 to bypass the memory 50, from an input of the memory 50 to an output thereof. In FIG. 14, an exclusive OR (logic circuit test data) D0 of the logic circuit test data D1 to D3 is transferred to the logic circuit 3 by using an exclusive-OR gate 52a. It is necessary to include switching circuits (multiplexers) 41x to 41z in the bypass circuit 40x which, when the memory 50 is tested, switch inputs to the memory 50 from the logic circuit test data D1 to D3 to the memory write test data TD1, address signal TA and memory control signal TWEN from the BIST circuit 30. Further, it is necessary to include a multiplexer 43x in the bypass circuit 40x, which switches inputs to the logic circuit 3 from system data to the logic circuit test data D0 when the logic circuit 3 is tested and vice versa when normal operation is performed.

As shown in FIG. 14, in testing of the logic circuit 3, the logic circuit test data D1 to D3 from the logic circuit 3 are branched at the inputs of the multiplexers 41x to 41z, respectively, and, after passing through the exclusive-OR gate 52a and the multiplexer 43x, propagated to the logic circuit 3. On the other hand, in testing of the memory 50, the multiplexers 41x to 41z select the memory write test data TD1, address signal TA and memory control signal TWEN from the BIST circuit 30, respectively, and transfer this information to the memory 50. The memory read test data TQ1 is branched at the input of the multiplexer 43x and transferred to the BIST circuit 30. That is, the logic circuit test data D0 to D3 for the test on the logic circuit 3 pass along different signal lines from those for the memory write test data TD1, address signal TA, memory control signal TWEN, and memory read test data TQ1 for the test on the memory 50. Accordingly, it is possible to test the logic circuit 3 and the memory 50 in parallel and therefore to reduce time for the tests.

However, in the bypass circuit 40x, neither the logic circuit test data D0 to D4 for the test on the logic circuit 3 nor the memory write test data TD1, address signal TA, memory control signal TWEN, and memory read test data TQ1 for the test on the memory 50 pass along signal lines L11 to L13 and L17 between the multiplexers 41x to 41z and 43x, and the branching points on the inputs thereof, respectively. Accordingly, the signal lines L11 to L13 and L17 are left non-tested, and therefore the fault coverage is decreased.

In comparison with the bypass circuit 40x, in a bypass circuit 40y shown in FIG. 15, branching points to the exclusive-OR gate 52a and the memory 50 are provided at the outputs of the multiplexers 41x to 41z so that no signal line is left non-tested. Moreover, a branching point to the logic circuit 3 and the BIST circuit 30 is provided at the output of the multiplexer 43x. According to the bypass circuit 40y, if the logic circuit 3 and the memory 50 are sequentially tested, all the signal lines can be tested. In the bypass circuit 40, however, the logic circuit test data D1 to D3, and the memory write test data TD, address signal TA and memory control signal TWEN pass along the same signal lines L14 to 16, respectively. Further, the memory read test data TQ1 and the logic circuit test data D0 pass along the same signal line L18. That is to say, the signal lines are overlapped. Therefore, the logic circuit 3 and the memory 50 cannot be tested in parallel, and accordingly, test time cannot be reduced.

SUMMARY OF THE INVENTION

A feature of the present invention inheres in a semiconductor integrated circuit including: a logic circuit to be tested; a memory connected the logic circuit to be tested; a built-in self test circuit for testing the memory; and a bypass circuit connected between the memory and the logic circuit and between the memory and the built-in self test circuit, the bypass circuit has a parallel test path for testing the logic circuit and the memory in parallel, and a signal line test path for testing non-tested signal lines in the parallel test path, and the bypass circuit selectively switches the parallel test path and the signal line test path.

DETAILED DESCRIPTION OF THE INVENTION

Figure 1:
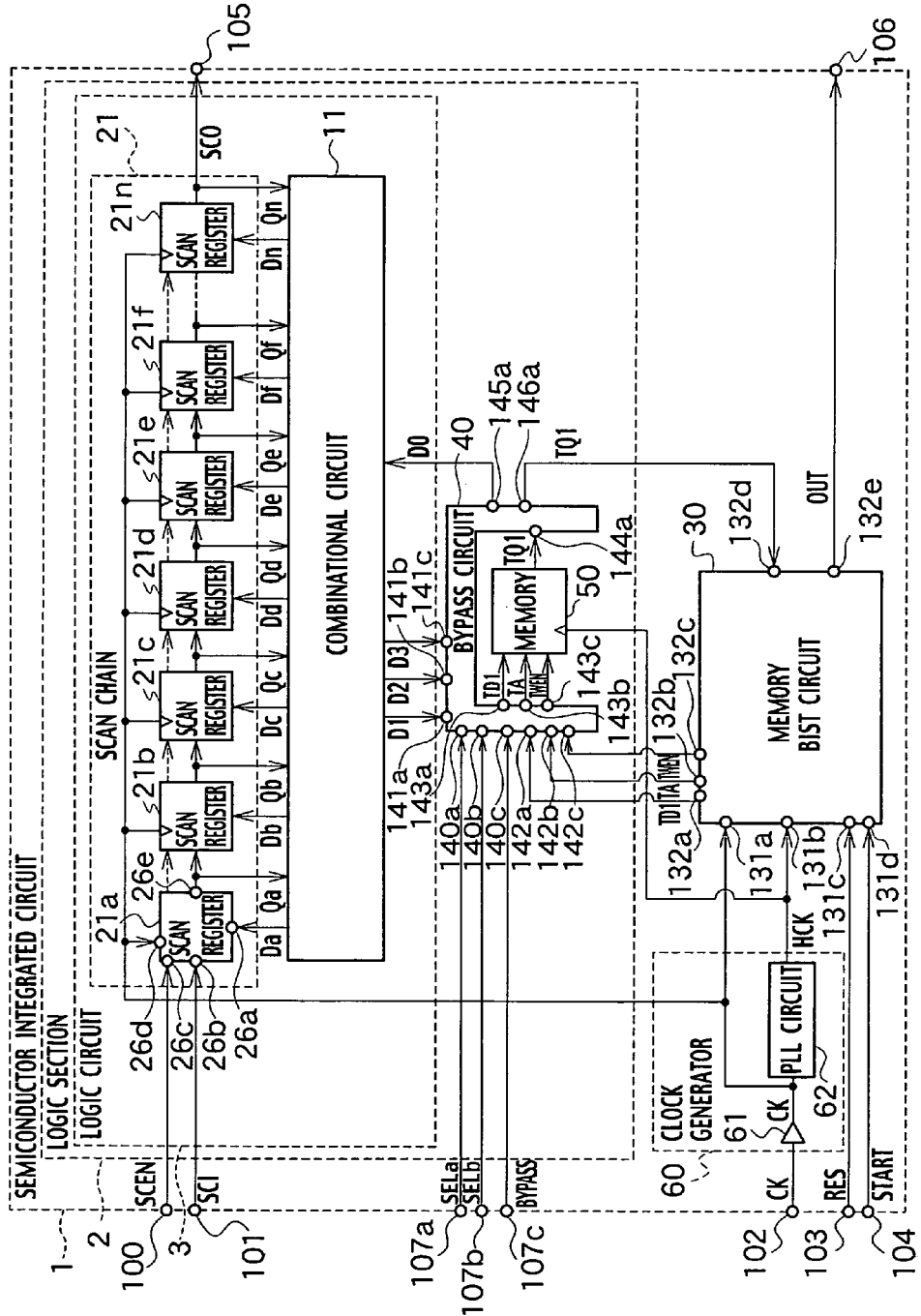
FIG. 1 is a circuit diagram showing an example of a semiconductor integrated circuit according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set fourth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

FIRST EMBODIMENT

As shown in FIG. 1, a semiconductor integrated circuit 1 according to a first embodiment of the present invention includes a logic circuit 3 to be tested, a memory 50 connected the logic circuit 3 to be tested, a BIST circuit (memory BIST circuit) 30 for testing the memory 50, and a bypass circuit 40 connected between the memory 50 and the logic circuit 3 and between the memory 50 and the BIST circuit 30. The bypass circuit 40 has a parallel test path for testing the logic circuit 3 and the memory 50 in parallel, and a signal line test path for testing non-tested signal lines in the parallel test path, and the bypass circuit selectively switches the parallel test path and the signal line test path.

The memory 50, the bypass circuit 40 and the logic circuit 3 are included in a logic section 2. A clock generation circuit 60 is connected with the memory 50, the logic section 2 and the BIST circuit 30. The clock generation circuit 60 includes a buffer 61 connected with an external clock input terminal 102, and a PLL circuit 62 connected with the buffer 61. The buffer 61 buffers an external clock CK supplied from an external controller or the like via the external clock input terminal 102. The PLL circuit 62 multiplies frequency of the external clock CK, and generates a high-speed clock HCK which is faster than the external clock CK.

Figure 2:
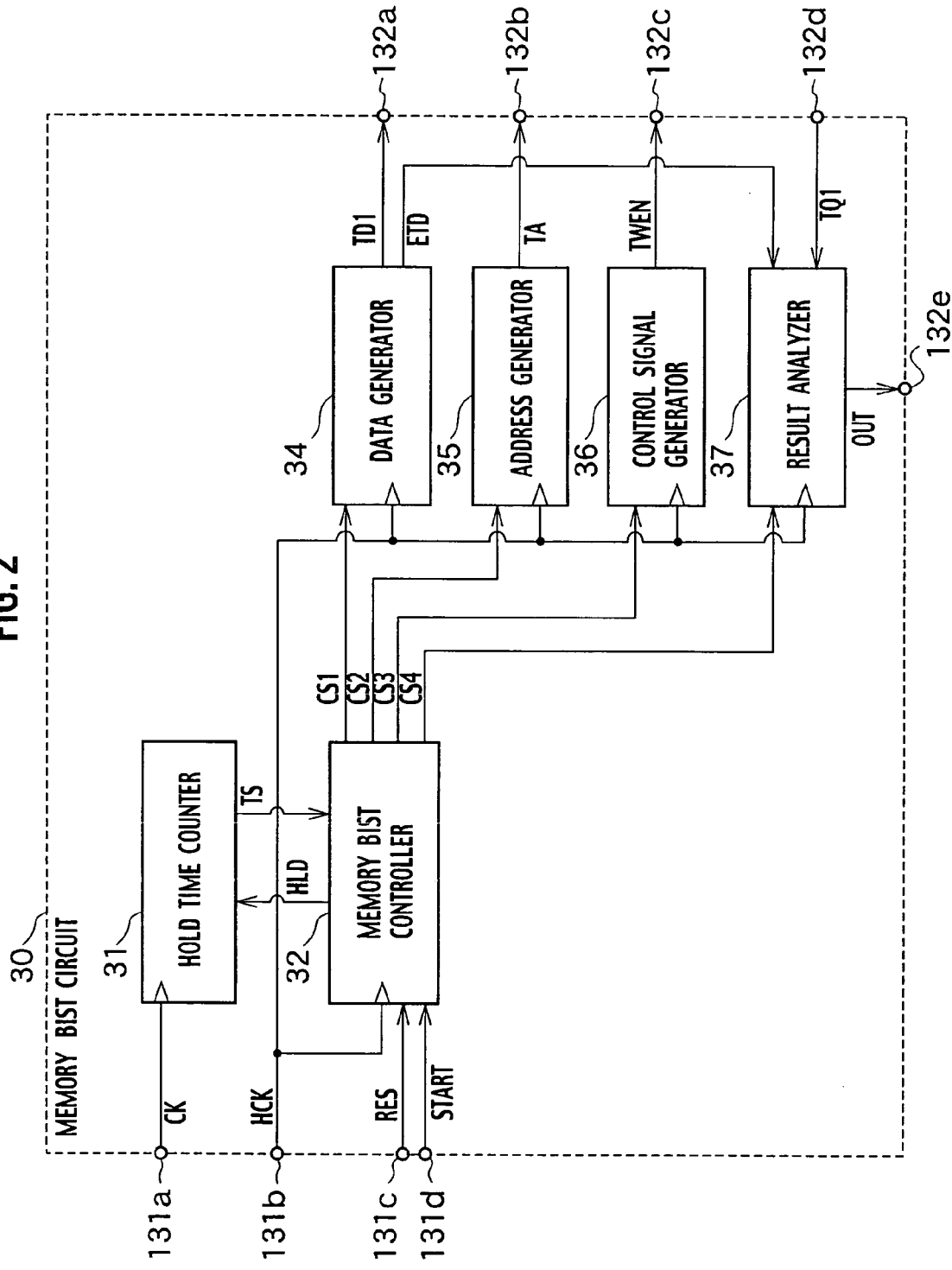
FIG. 2 is a circuit diagram showing an example of a BIST circuit according to the first embodiment of the present invention.

The BIST circuit 30 shown in FIG. 1 tests the memory 50 in the logic section 2. The BIST circuit 30 includes input terminals 131a to 131d connected with the buffer 61, the PLL circuit 62, a reset signal input terminal 103, and a memory test start signal input terminal 104, respectively. Moreover, the BIST circuit 30 includes output terminals 132a to 132c connected with test input terminals 142a to 142c of the bypass circuit 40 respectively, an input terminal 132d connected with a test output terminal 146a of the bypass circuit 40, and an output terminal 132e connected with a decision signal output terminal 106. As shown in FIG. 2, the BIST circuit 30 has a hold time counter 31 connected with the input terminal 131a, a memory BIST control circuit 32 connected with the input terminals 131b to 131d and hold time counter 31, a data generator 34 connected with the memory BIST control circuit 32, the input terminal 131b and the output terminal 132a, an address generator 35 connected with the memory BIST control circuit 32, the input terminal 131b and the output terminal 132b, a control signal generator 36 connected with the memory BIST control circuit 32, input terminal 131b and output terminal 132c, and a result analyzer 37 connected with the memory BIST control circuit 32, the data generator 34, the input terminals 13b, 132d, and the output terminal 132e.

The memory BIST control circuit 32, the data generator 34, the address generator 35, the control signal generator 36, and the result analyzer 37, shown in FIG. 2, each synchronize with high-speed clocks HCK from the PLL circuit 62 shown in FIG. 1. The memory BIST control circuit 32 shown in FIG. 2 initializes the memory BIST 30 when a reset signal RES is transmitted thereto from an external controller or the like via the reset signal input terminal 103. The memory BIST control circuit 32 starts a test on the memory 50 in the logic section 2 shown in FIG. 1 when a memory test start signal START is transmitted to the memory BIST control circuit 32 from an external controller or the like via the memory test start signal input terminal 104. The memory BIST control circuit 32 generates memory test control signals CS1 to CS4 for controlling the data generator 34, the address generator 35, the control signal generator 36, and the result analyzer 37, respectively.

In response to the memory test control signal CS1 from the memory BIST control circuit 32, the data generator 34 shown in FIG. 2 generates memory write test data TD1 for a test on the memory 50 in the logic section 2 shown in FIG. 1 and an expected value ETD equivalent to the memory write test data TD1. The memory write test data TD1 is transmitted to the memory 50 via the output terminal 132a and the bypass circuit 40 in the logic section 2 shown in FIG. 1. The expected value ETD is transmitted to the result analyzer 37. Note that FIG. 2 is a schematic diagram, and the data generator 34 may generate a plurality of memory write test data TD1, TD2, TD3, . . . , depending on the type of the memory 50.

The address generator 35, in response to the memory test control signal CS2 from the memory BIST control circuit 32, generates an address signal TA for designating an address on the memory 50 in which the memory write test data TD1 will be written. The address signal TA is transmitted to the memory 50 via the output terminal 132b and the bypass circuit 40 in the logic section 40 shown in FIG. 1.

The control signal generator 36 shown in FIG. 2, in response to the memory test control signal CS3 from the memory BIST control circuit 32, generates a memory control signal TWEN for controlling the write and read states of the memory 50. The memory control signal TWEN is transmitted to the bypass circuit 40 in the logic section 2 shown in FIG. 1 via the output terminal 132c. The memory control signal employs a plurality of different types of signals including a read enable signal for controlling the memory 50 to go into a read state, a write enable signal for controlling the memory 50 to go into a write state, a chip enable signal, a bit write enable signal, etc., any of which is suitably set depending on the type of memory 50.

The result analyzer 37 shown in FIG. 2, in response to the memory test control signal CS4 from the memory BIST control circuit 32, compares the expected value ETD from the data generator 34 and memory read test data TQ1 read from the memory 50 in the logic section 2 shown in FIG. 1, and then generates a decision signal OUT. The decision signal OUT is transmitted to an external tester or the like via the output terminal 132e. Based on the decision signal OUT, the external tester or the like determines whether or not the memory 50 is defective.

Moreover, in testing of the memory 50 by using the BIST circuit 30, a retention test is executed. Here, the "retention test" is a test to determine whether the memory 50 is capable of keeping storage information for a period of hold time after the storage information for the test on the memory 50 is written onto the memory 50. In the retention test, when it is completed to write the memory write test data in all the bits on the memory 50, the memory BIST control circuit 32 temporarily suspends the access to the memory 50 to bring the memory 50 into an operation hold mode, and generates a write end signal HLD. The memory BIST control circuit 32 terminates the operation hold mode when a time lapse signal TS is transmitted thereto, and then restarts the access to the memory 50.

The hold time counter 31, in synchronization with external clocks CK transmitted from the external clock input terminal 102 via the buffer 61 shown in FIG. 1, counts hold time necessary for the retention test on the memory 50 in the logic section 2. The hold time counter 31 shown in FIG. 2 starts counting the hold time when the hold time counter 31 receives the write end signal HLD, as a trigger signal, from the memory BIST control circuit 32. Further, when the hold time has elapsed, the hold time counter 31 generates a time lapse signal TS and transmits the time lapse signal TS to the memory BIST control circuit 32.

The memory 50 shown in FIG. 1 synchronizes with high-speed clocks HCK from the PLL circuit 62. When the memory 50 is controlled to go to a write state by the memory control signal TWEN, the memory write test data TD1 is written in an address on the memory 50 designated by the address signal TA. When the memory 50 is controlled to go to a read state by the memory control signal TWEN, the memory read test data TQ1 corresponding to the memory write test data TD1 is read from the memory 50. For the memory 50, for example, a SRAM, DRAM or the like can be employed. Note that FIG. 1 is a schematic diagram in which some inputs and outputs to/from the memory 50 are omitted. That is, in reality, the memory 50 has a large number of inputs and outputs.

The logic circuit 3 shown in FIG. 1, for example, has a scan chain 21 and a combinational circuit 11 connected with the scan chain 21. The scan chain 21 has a plurality of scan registers 21a to 21n, connected in series with each other, each of which is connected with the external clock input terminal 102 via the buffer 61 and with a scan enable signal input terminal 100. The input of the first-stage register 21a is connected with a scan data input terminal 101. The output of the last-stage scan register 21n is connected with a scan result data output terminal 105. The scan registers 21a to 21n are those obtained by converting a plurality of registers for use in normal operation by using a scan design technique, in order to execute a scan test which is one of the tests on the logic circuit 3. The scan register 2i a to 21n are capable of being externally controlled and observed via a shift path. Note that the number of the scan registers 21a to 21n to be included in the scan chain 11 is not particularly limited.

Figure 3:
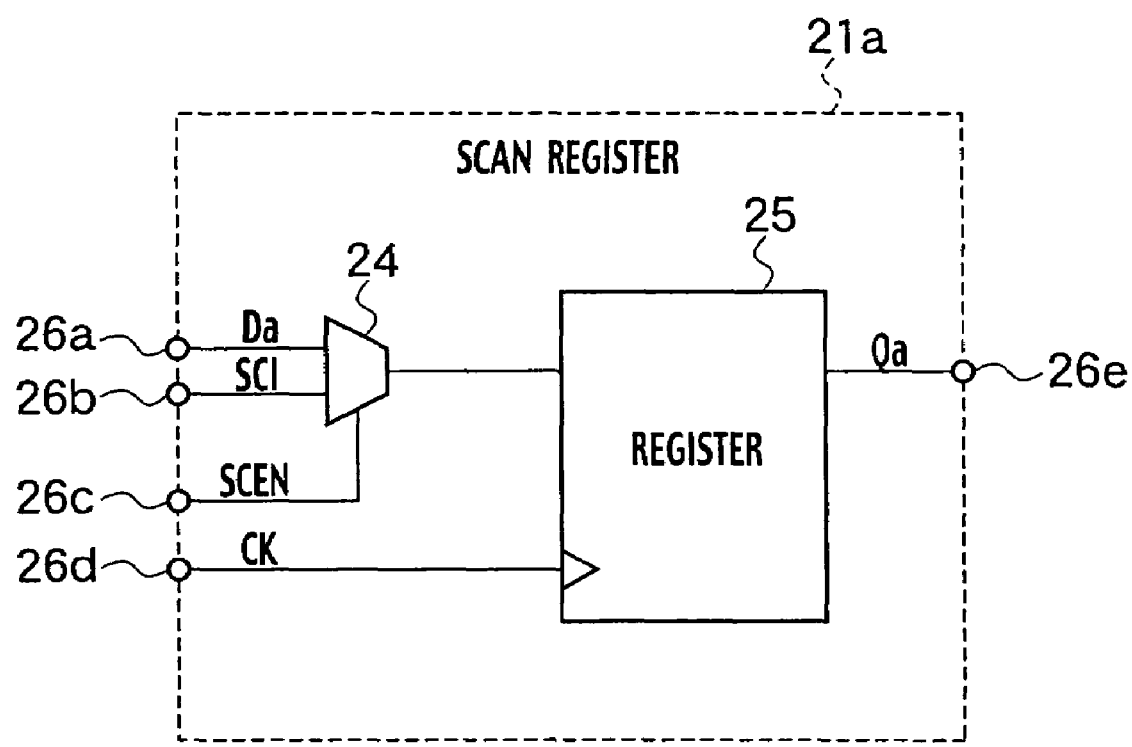
FIG. 3 is a circuit diagram showing an example of a register according to the first embodiment of the present invention.

The scan register 21a has input terminals 26a to 26d connected with the combinational circuit 11, the scan data input terminal 101, the scan enable signal input terminal 100, and the buffer 61, respectively, and an output terminal 26e connected with the scan register 21b and the combination circuit 11. As shown in FIG. 3, the scan register 21a has a multiplexer 24 with the input is connected to, for example, the input terminals 26a and 26b, and a register 25. The input of the register 25 is connected with the multiplexer 24 and the input terminal 26d. The output of the register 25 is connected with the output terminal 26e. The multiplexer 24 is controlled by a scan enable signal SCEN input from the scan enable signal input terminal 100 shown in FIG. 1 via the input terminal 26c. Each of the scan registers 21b to 21n shown in FIG. 1 is configured similarly to the scan register 21a shown in FIG. 3, and therefore a redundant description will be omitted.

The combinational circuit 11 shown in FIG. 1 is connected with the scan registers 21a to 21n, system input terminals 141a to 141c of the bypass circuit 40, and a system output terminal 145a of the bypass circuit 40. The combinational circuit 11 is a logic part of the logic circuit 3, an output of the logic part being uniquely determined by an input condition.

When testing the logic circuit 3, scan data SCI is supplied to the scan register 21a in the scan chain 21 from an external tester or the like via the scan data input terminal 101. Synchronizing with external clocks CK, the scan registers 21a to 21(n-1) shift the scan data SCI to the scan registers 21b to 21n at the next stage, respectively. For example, in the scan register 21a, as shown in FIG. 3, the multiplexer 24 transmits scan data SCI, transmitted via the input terminal 26b, to the register 25 in response to a scan enable signal SCEN. The register 25 receives this scan data SCI and, in synchronization with an external clock CK, shifts the scan data SCI to the scan register 21b shown in FIG. 1. By repeating the shift operation, the scan data SCI is received in all the scan registers 21a to 21n.

The scan data Qa to Qn, received in the scan registers 21a to 21 respectively, are input to the combinational circuit 11, and the combinational circuit 11 is then tested. Logic circuit test data D1 to D3 from the combinational circuit 11 pass through the bypass circuit 40 so as to bypass the memory 50, and logic circuit test data D0 responding to the logic circuit test data D1 to D3 is transmitted from the system output terminal 145a to the combinational circuit 11 (details of the configuration of the bypass circuit 40 will be described later). Test results Da to Dn of the test on the combinational circuit 11 are received in the scan registers 21a to 21n, respectively.

Synchronizing with external clocks CK, the scan registers 21a to 21n shift the test results Da to Dn in serial. By performing the shift operation, scan result data SCO from the last-stage scan register 21n is transmitted to an external tester via the scan result data output terminal 105. Based on the scan result data SCO, the external tester determines whether or not the logic circuit 3 including the scan chain 21 and the combinational circuit 11 is defective.

Note that, in normal operation, the combinational circuit 11 transmits data to each of the scan registers 21a to 21n. The scan registers 21a to 21n receive the data and transmit data to the combinational circuit 11 individually, in synchronization with system clocks for use in normal operation. Data from the combinational circuit 11 is transmitted to the memory 50 through the bypass circuit 40. Data read from the memory 50 is transmitted to the combinational circuit 11 through the bypass circuit 40.

Figure 4:
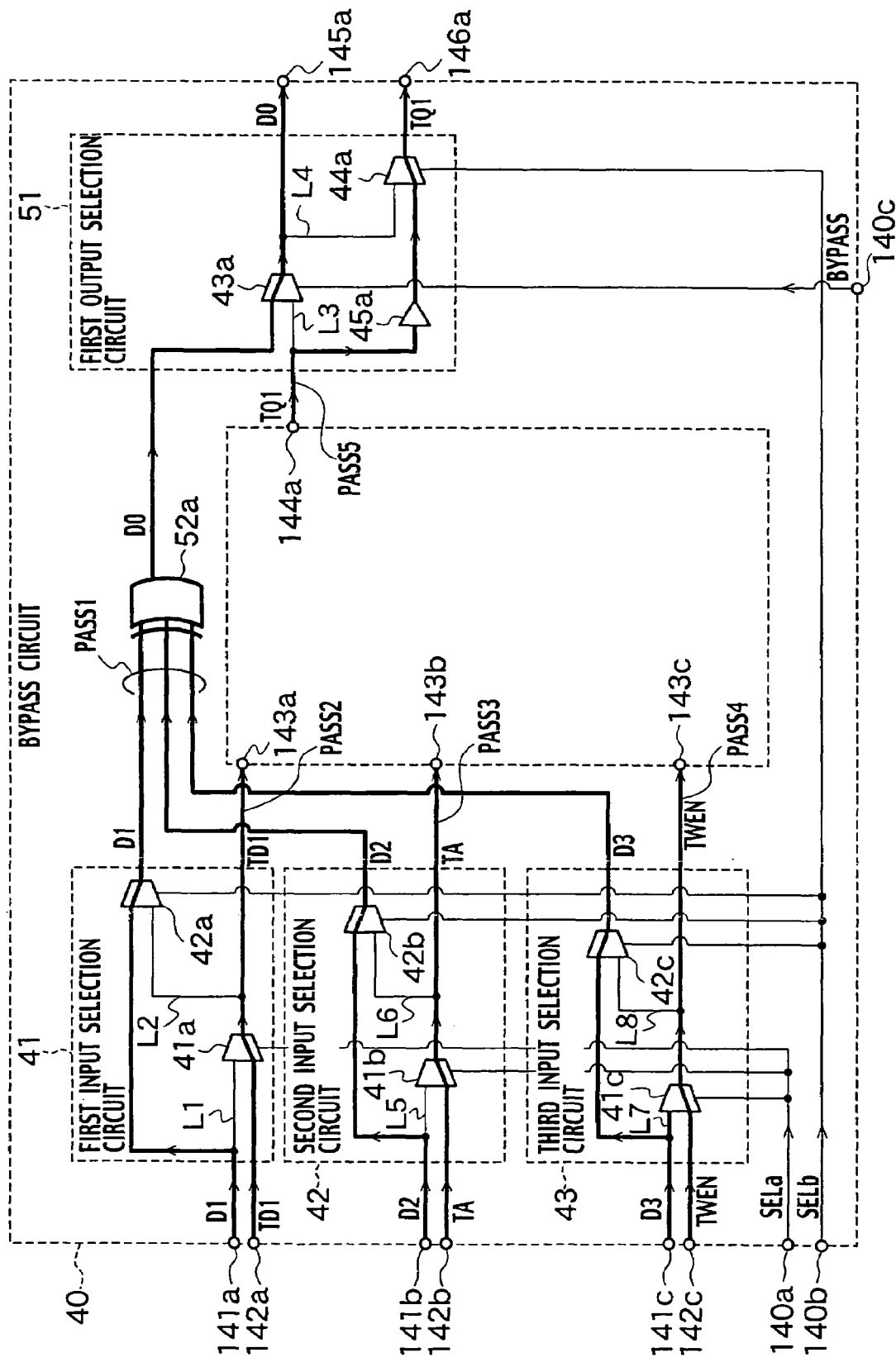
FIGS. 4 to 6 are circuit diagrams showing an example of a bypass circuit according to the first embodiment of the present invention.

The bypass circuit 40 shown in FIG. 1 includes input terminals 140a to 140c connected with a selection control signal output terminal 107a, 107b and a bypass mode selection control signal output terminal 107c respectively, the system input terminals 141a to 141c and system output terminal 145a connected with the combinational circuit 11, output terminals 143a to 143c and an input terminal 144a connected with the memory 50, and the test input terminals 142a to 142c and test output terminal 146a connected with the BIST circuit 30. As schematically shown in FIG. 4, the bypass circuit 40 includes first to third input selection circuits 41 to 43, an exclusive-OR gate 52a connected with the first to third input selection circuits 41 to 43, and a first output selection circuit 51 connected with the exclusive-OR gate 52a.

The input selection circuit 41 has a first input pre-multiplexer 41a, the input is connected with the system input terminal 141a and the test input terminal 142a, and the output is connected with the output terminal 143a. Moreover, the input selection circuit 41 has a first input post-multiplexer 42a, the input of which is connected with the system input terminal 141a and the first input pre-multiplexer 41a. The second input selection circuit 42 includes a second input pre-multiplexer 41b, the input of which is connected with the system input terminal 141b and the test input terminal 142b and the output of which is connected with the output terminal 143b. Moreover, the second input selection circuit 42 has a second input post-multiplexer 42b, the input of which is connected with the system input terminal 141b and the second input pre-multiplexer 41b. The third input selection circuit 43 includes a third input pre-multiplexer 41c the input of which is connected with the system input terminal 141c and test input terminal 142c and the output of which is connected with output terminal 143c. Moreover, the input selection circuit 43 has a third input post-multiplexer 42c, the input of which is connected with the system input terminal 141c and the third input pre-multiplexer 41c. Each of the first to third input pre-multiplexers 41a to 41c is controlled by a selection control signals SELa transmitted from the common input terminal 140a, and switches propagating signals. Each of the first to third input post-multiplexers 42a to 42c is controlled by selection control signals SELb transmitted from the common input terminal 140b, and switches propagating signals.

The input of the exclusive-OR gate 52a is connected with the first to third input post-multiplexers 42a to 42c. The first output selection circuit 51 includes a first output pre-multiplexer 43a, a first output post-multiplexer 44a, and a buffer 45a. The input of the first output pre-multiplexer 43a is connected with the input terminal 144a and the exclusive-OR gate 52a, and the output thereof is connected with the system output terminal 145a. The input of the first output post-multiplexer 44a is connected with the first output pre-multiplexer 43a and the input terminal 144a, and the output thereof is connected with the test output terminal 146a. The buffer 45a is connected between the input terminal 144a and the first output post-multiplexer 44a. The first output pre-multiplexer 43a is controlled by a bypass selection control signal BYPASS transmitted from the input terminal 140c, and switches propagating signals. The first output post-multiplexer 44a is controlled by a selection control signal SELb transmitted from the input terminal 140b, and switches propagating signals.

Figure 14:
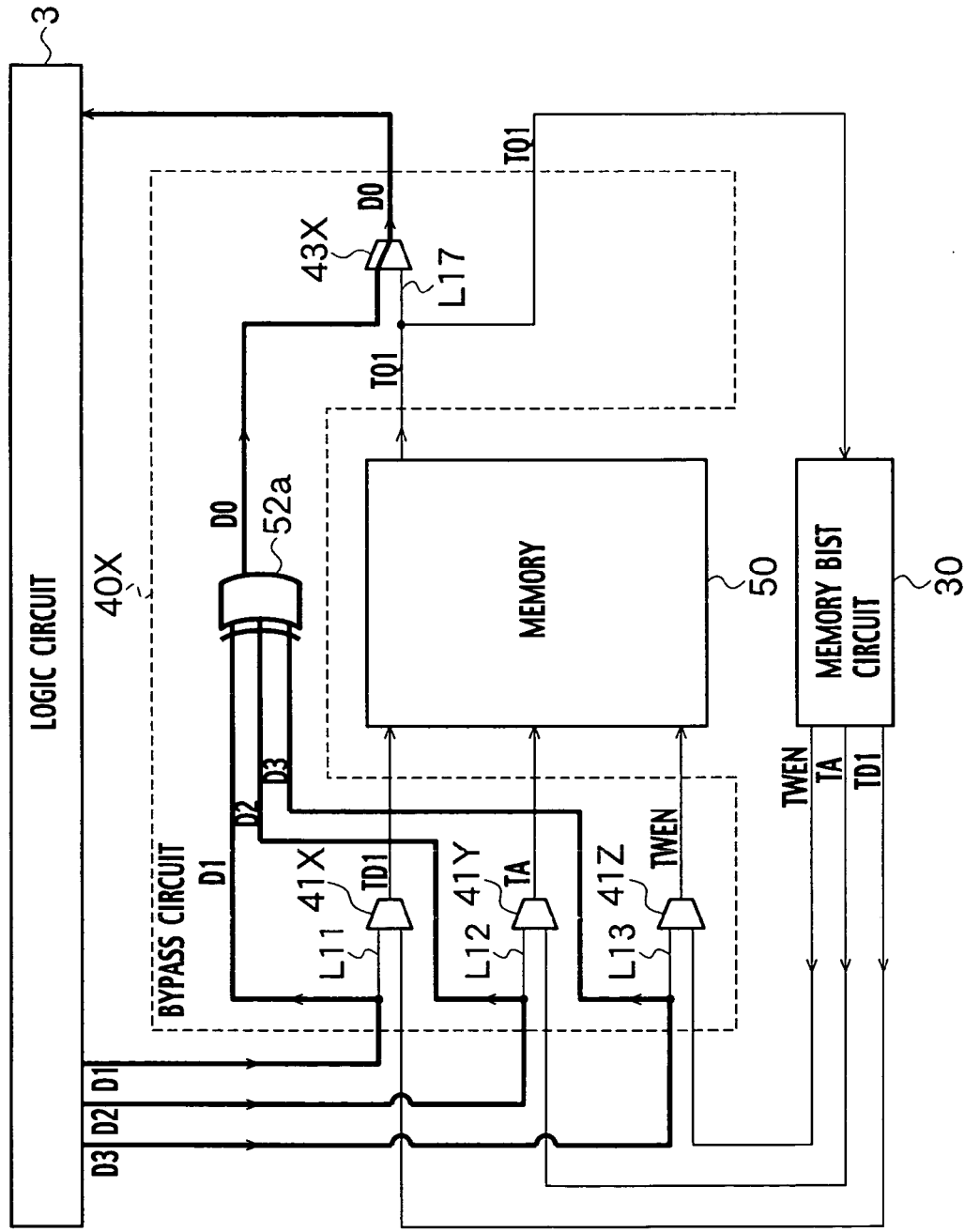
FIGS. 14 to 15 are circuit diagrams showing an example of conventional bypass circuit respectively.
Figure 15:
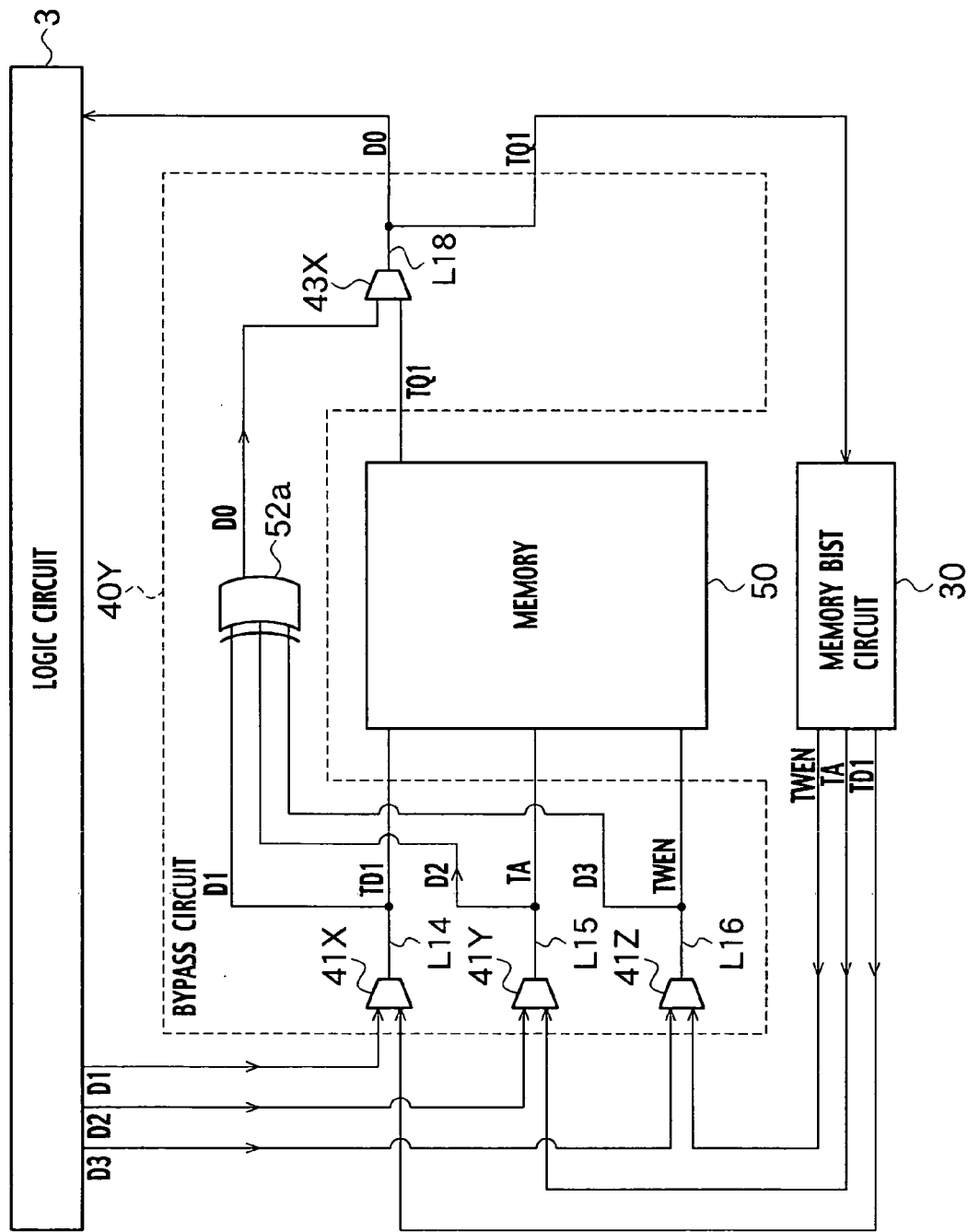

That is, the multiplexers in two stages (the first to third input pre-multiplexers 41a to 41c and the first to third input post-multiplexers 42a to 42c) are disposed on the input of the memory 50. The multiplexers in two stages (the first output pre-multiplexer 43a and the first output post-multiplexer 44a) are disposed on the output of the memory 50. The bypass circuit 40 is different on this point from bypass circuits 40x and 40y shown in FIGS. 14 and 15 respectively, each of which has single stage multiplexers 41x to 41z and 43x, on the input and outputs of the memory 50.

In the bypass circuit 40, the first input pre-multiplexer 41a, in response to a selection control signal SELa from the input terminal 140a, selects one of the logic circuit test data D1 transmitted from the combination circuit 11, via the system input terminal 141a, and the memory write test data TD1 transmitted from the data generator 34 shown in FIG. 2, via the test input terminal 142a. The first input post-multiplexer 42a, in response to a selection control signal SELb from the input terminal 140b, selects one of the logic circuit test data D1 transmitted directly from the system input terminal 141a, and the logic circuit test data D1 transmitted from the system input terminal 141a, via the first input pre-multiplexer 41a.

The second input pre-multiplexer 41b, in response to a selection control signal SELa from the input terminal 140a, selects one of the logic circuit test data D2 transmitted from the combinational circuit 11, via the system input terminal 141b, and the address signal TA transmitted from the address generator 35 shown in FIG. 2, via the test input terminal 142b. The second input post-multiplexer 42b, in response to a selection control signal SELb from the input terminal 140b, selects one of the logic circuit test data D2 transmitted directly from the system input terminal 141b, and the logic circuit test data D2 transmitted from the system input terminal 141b, via the second input pre-multiplexer 41b.

The third input pre-multiplexer 41c in response to a selection control signal SELa from the input terminal 140a, selects one of the logic circuit test data D3 transmitted directly from the system input terminal 141c, and the memory control signal TWEN transmitted from the control signal generator 36 shown in FIG. 2, via the test input terminal 142c. The third input post-multiplexer 42c, in response to a selection control signal SELb from the input terminal 140b, selects one of the logic circuit test data D3 transmitted directly from the system input terminal 141c, and the logic circuit test data D3 transmitted from the system input terminal 141b, via the third input pre-multiplexer 41c.

The exclusive-OR gate 52 transmits, as the logic circuit test data D0, the exclusive OR of the logic circuit test data D1 to D3 transmitted from the first to third input post-multiplexers 42a to 42c respectively, to the first output selection circuit 51. The first output pre-multiplexer 43a, based on a bypass mode selection control signal BYPASS transmitted via the input terminal 140c, selects one of the logic circuit test data D0 transmitted from the exclusive-OR gate 52a, and the memory read test data TQ1 read from the memory 50. The first output post-multiplexer 44a, in response to a selection control signal SELb from the input terminal 140b, selects one of the memory read test data TQ1 transmitted from the input terminal 144a, via the first output pre-multiplexer 43a, and the memory read test data TQ1 transmitted from the input terminal 144a, via the buffer 45a, and then transmits the selected data to the result analyzer 37 shown in FIG. 2, via the test output terminal 146a.

In normal operation, the first to third input pre-multiplexers 41a to 41c shown in FIG. 4 select data transmitted from the combinational circuit 11 shown in FIG. 1 via the system input terminals 141a to 141c respectively, and transmit the selected data to the memory 50 via the output terminals 143a to 143c respectively. The first output pre-multiplexer 43a shown in FIG. 4 selects data which is read from the memory 50 shown in FIG. 1 and transmitted via the input terminal 144a, and transmits the selected data to the combinational circuit 11 via the system output terminal 145a.

<First State of Bypass Circuit>

Next, a description will be given of an example of the state of the bypass circuit 40 when the logic circuit 3 and the memory 50 are tested in parallel. In testing the memory 50, memory write test data TD1, an address signal TA and a memory control signal TWEN are transmitted from the BIST circuit 30 to the bypass circuit 40. The bypass circuit 40 is controlled by selection control signals SELa, SELb and a bypass selection control signal BYPASS to assume a state that enables parallel test paths PASS1 to PASS5 indicated by the bold lines in FIG. 4.

In the bypass circuit 40, the first to third input pre-multiplexers 41a to 41c select the memory write test data TD1, the address signal TA and the memory control signal TWEN from the test input terminals 142a to 142c, respectively. The memory 50 shown in FIG. 1 is brought into a write state by the memory control signal TWEN, and the memory write test data TD1 is written in an address designated by the address signal TA. Thereafter, the memory 50 is brought into a read state by the memory control signal TWEN, and memory read test data TQ1 corresponding to the memory write test data TD1 is read from the memory 50. The first output post-multiplexer 44a shown in FIG. 4 selects the memory read test data TQ1 transmitted via the input terminal 144a. The memory read test data TQ1 is transmitted to the result analyzer 37 shown in FIG. 2, via the test output terminal 146a.

In testing of the logic circuit 3 in parallel with the testing of the memory 50, logic circuit test data D1 to D3 are individually transmitted from the combinational circuit 11 to the bypass circuit 40. In the bypass circuit 40 shown in FIG. 4, the first to third input post-multiplexers 42a to 42c select the logic circuit test data D1 to D3 from the system input terminals 141a to 141c, respectively. The exclusive-OR gate 52a transmits the exclusive OR of the logic circuit test data D1 to D3 from the first to third input post multiplexers 42a to 42c respectively, as logic circuit test data D0. The first output pre-multiplexer 43a selects the logic circuit test data D0 from the exclusive-OR gate 52a. The logic circuit test data D0 is transmitted to the combinational circuit 11 shown in FIG. 1 via the system output terminal 145a.

According to the bypass circuit 40, it is possible to test the logic circuit 3 and the memory 50 in parallel by switching to the state that enables the parallel test paths PASS1 to PASS5 shown in FIG. 4. Accordingly, it is possible to greatly reduce test time in comparison with a case of testing the logic circuit 3 and the memory 50 individually.

Note that when the memory 50 and the logic circuit 3 are tested in parallel, as shown in FIG. 4, signal lines L1 to L8 are not tested. Specifically, a first signal line Li between the system input terminal 141a and the first input pre-multiplexer 41a, a second signal line L2 between the first input pre-multiplexer 41a and the first input post-multiplexer 42a, a third signal line L3 between the input terminal 144a and the first output pre-multiplexer 43a, a fourth signal line L4 between the first output pre-multiplexer 43a and the first output post-multiplexer 44a, a fifth signal line L5 between the system input terminal 141b and the second input pre-multiplexer 41b, a sixth signal line L6 between the second input pre-multiplexer 41b and the second input post-multiplexer 42b, a seventh signal line L7 between the system input terminal 141c and the third input pre-multiplexer 41c, and an eighth signal line L8 between the third input pre-multiplexer 41a and the third input post-multiplexer 42c are not tested.

<Second State of Bypass Circuit>

Next, a description will be given of an example of the state of the bypass circuit 40 when the memory 50 is tested. Here, the third signal line L3 and the fourth signal line L4, which are not tested in the parallel test paths PASS1 to PASS5 shown in FIG. 4, are tested.

The BIST circuit 30 shown in FIG. 1 transmits memory write test data TD1, an address signal TA and a memory control signal TWEN to the bypass circuit 40 respectively. The bypass circuit 40 is controlled by selection control signals SELa, SELb and a bypass selection control signal BYPASS to go into a state that enables the signal line test paths (memory test paths) PASS2 to PASS4, PASS6 indicated by the bold lines in FIG. 5.

In the bypass circuit 40, the first to third input pre-multiplexers 41a to 41c respectively select the memory write test data TD1, the address signal TA and the memory control signal TWEN from the test input terminals 142a to 142c. The memory write test data TD1, the address signal TA and the memory control signal TWEN are input to memory 50 via the output terminals 143a to 143c. Thereafter, the memory 50 is brought into a read state by the memory control signal TWEN, and memory read test data TQ1 corresponding to the memory write test data TD1 is read from the memory 50. The first output pre-multiplexer 43a selects the memory read test data TQ1 from the memory 50 via the input terminal 144a and the third signal line L3. The first output post-multiplexer 44a selects the memory read test data TQ1 transmitted from the first output pre-multiplexer 43a via the fourth signal line L4. The memory read test data TQ1 is transmitted to the result analyzer 37 shown in FIG. 2 via the test output terminal 146a.

Figure 5:
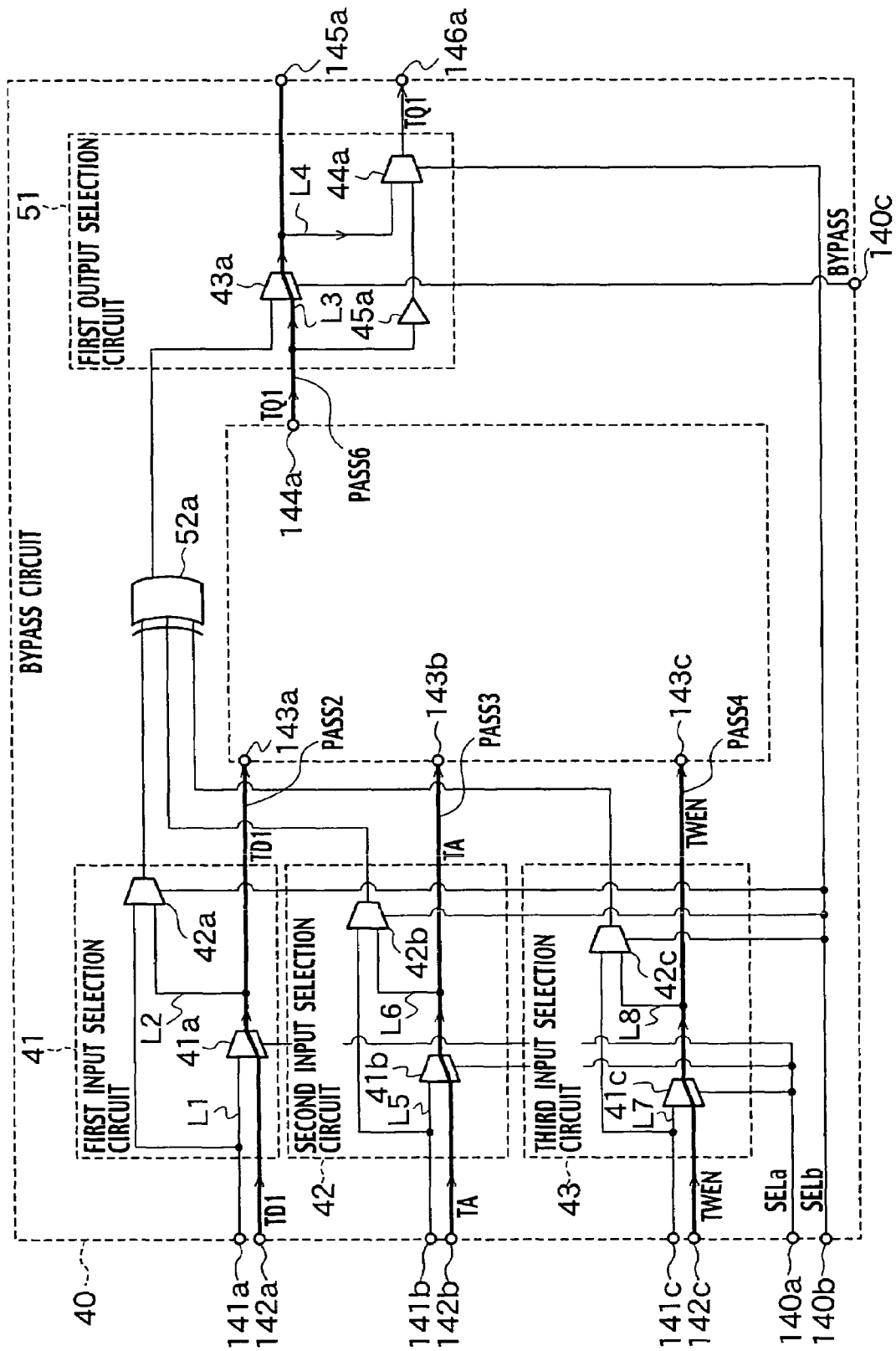

According to the bypass circuit 40, it is possible to test the third signal line L3 and the fourth signal line L4, which are not tested in the parallel test paths PASS1 to PASS5 shown in FIG. 4 when the memory 50 and the logic circuit 3 shown in FIG. 1 are tested, by switching to the state that enables the memory test paths PASS2 to PASS4, PASS6 shown in FIG. 5.

<Third State of Bypass Circuit>

Next, a description will be given of an example of the state of the bypass circuit 40 when the logic circuit 3 is tested. Here, the first signal line L1, the second signal line L2, the fifth signal to eighth lines L5 to L8, which are not tested in the parallel test paths PASS1 to PASS5 shown in FIG. 4, and the memory test paths PASS2 to PASS4, PASS6 shown in FIG. 5, are tested.

In a scan test, logic circuit test data D1 to D3 are transmitted from the combinational circuit 11 shown in FIG. 1 to the bypass circuit 40. The bypass circuit 40 is controlled by selection control signals SELa, SELb and a bypass selection control signal BYPASS to go into a state that enables the signal line test path (logic circuit test path) PASS7 indicated by the bold lines in FIG. 6.

In the bypass circuit 40, the first to third input pre-multiplexers 41a to 41c select the logic circuit test data D1 to D3 respectively transmitted via the first signal line L1, the fifth signal line L5, and the seventh signal line L7. The first to third input post-multiplexers 42a to 42c select the logic circuit test data D1 to D3 transmitted from the first to third input pre-multiplexers 41a to 41c via the second signal line L2, sixth signal line L6, and eighth signal line L8. The exclusive-OR gate 52a outputs exclusive OR of the logic circuit test data D1 to D3 from the first to third input post-multiplexers 42a to 42c as logic circuit test data D0. The first output pre-multiplexer 43a selects the logic circuit test data D0 from the exclusive-OR gate 52a. The logic circuit test data D0 is transmitted to the combinational circuit 11 shown in FIG. 1 via the system output terminal 145a.

Figure 6:
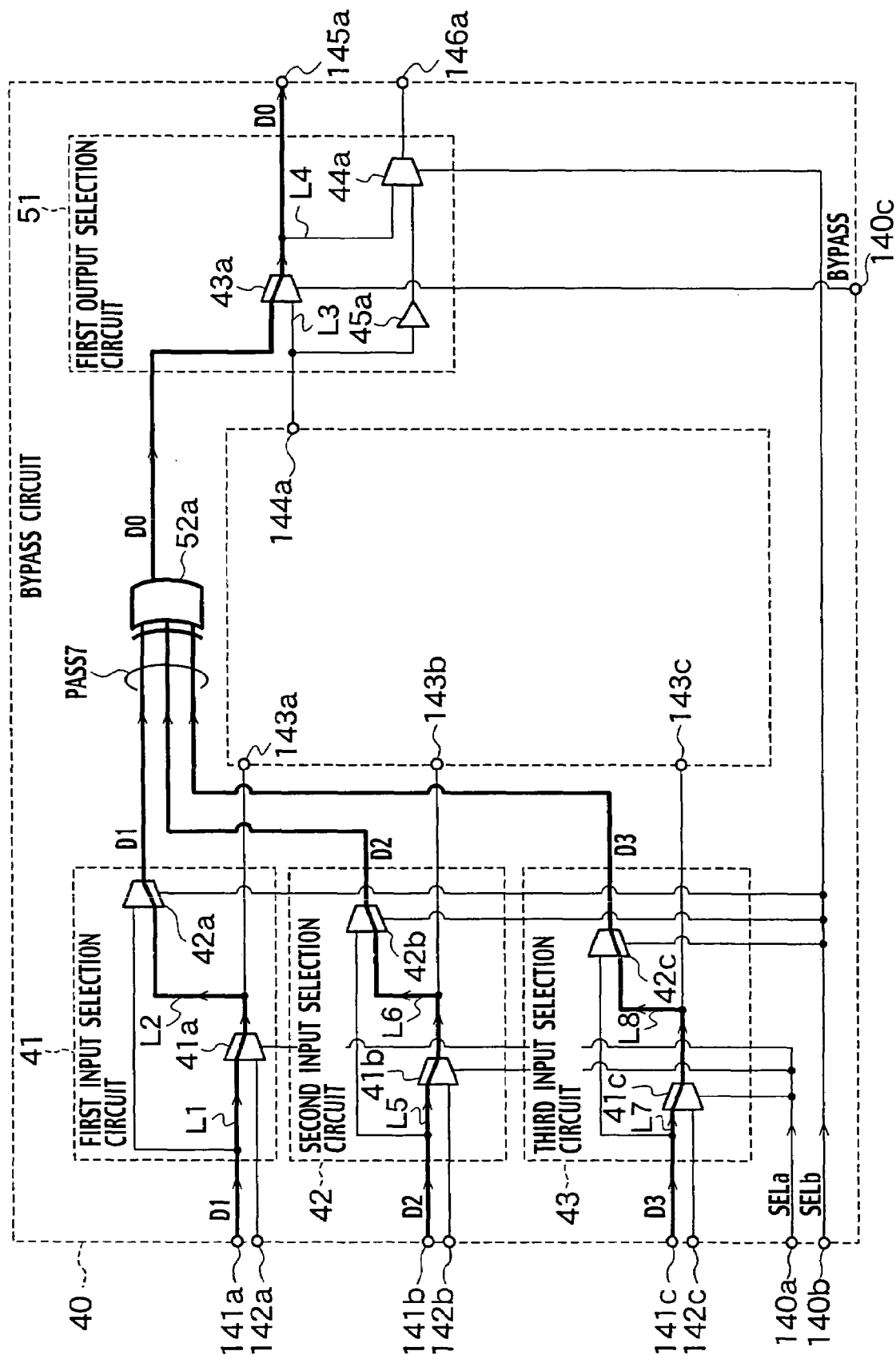

According to the bypass circuit 40, it is possible to test the first signal line L1, the second signal line L2, the fifth to eighth signal lines L5 to L8, which are not tested in the parallel test paths PASS1 to PASS5 shown in FIG. 4 and in the memory test paths PASS2 to PASS4, PASS6 shown in FIG. 5, by switching to the state that enables the logic circuit test path PASS7 shown in FIG. 6.

<First Test Method>

Next, a description will be given of a test method when testing the logic circuit 3 and the memory 50 shown in FIG. 1 in parallel, with reference to FIG. 7.

Figure 7:
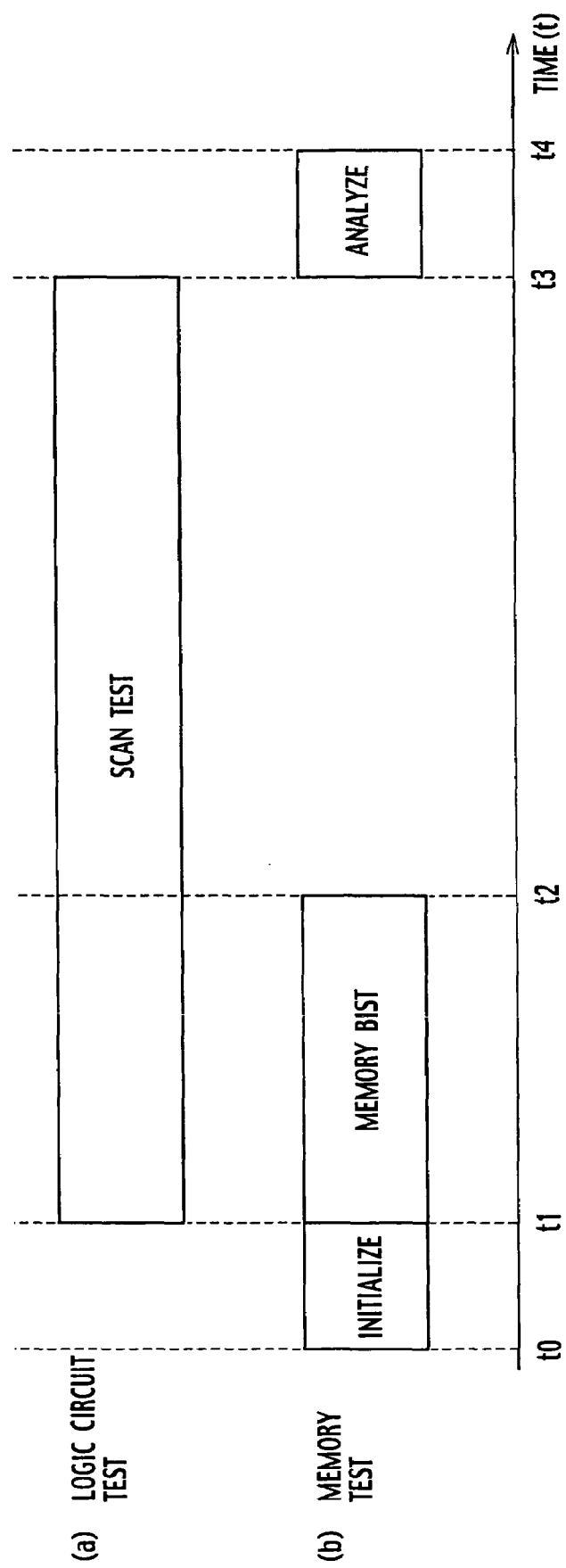
FIG. 7 is a graph for explaining an example of a method of testing a logic circuit and a memory in parallel according to the first embodiment of the present invention.

(a) During a period from time t0 to time t1 shown in FIG. 7, a reset signal RES is input from an external controller or the like via the reset signal input terminal 103 shown in FIG. 1. In response to the reset signal RES, the memory BIST control circuit 32 shown in FIG. 2 initializes the BIST circuit 30.

(b) At time t1 shown in FIG. 7, the execution of a scan test as shown in FIG. 1 is started. Simultaneously, a memory test start signal START is supplied to the memory BIST control circuit 32, and the execution of a memory BIST is started in parallel. Upon execution of the memory BIST, the bypass circuit 40 is controlled to go into a state that enables the parallel test paths PASS1 to PASS5 shown in FIG. 4. In the memory BIST, patterns to perform initialization and result determination are added before and after a test pattern for the scan test, respectively. Therefore, the operation in the memory BIST does not affect the operation in the scan test. Moreover, in the memory BIST, the memory BIST control circuit 30 is operated only by high-speed clocks HCK, and therefore does not affect the scan test. At time t2, the execution of the memory BIST is terminated.

(c) For a period from time t2 to time t3, the BIST circuit 30 halts, until the execution of the scan test is terminated. During the execution of the scan test, high-speed clocks HCK are continuously supplied to the BIST circuit 30. After all scan result data SCO have been transmitted to an external tester, the scan test is terminated at time t3. During a period from time t3 to time t4, the external tester determines, based on a decision signal OUT transmitted from the result analyzer 37, whether or not the memory is defective.

Note that before, or after, testing the logic circuit 3 and the memory 50 in parallel, the bypass circuit 40 is controlled to go into a state that enables the memory test paths PASS2 to PASS4 and PASS6 shown in FIG. 5, and a test on the memory 50 where the third and fourth signal lines L3 and L4 are fault detection targets is executed. Here, since the fault detection targets are the third and fourth signal lines L3 and L4, the test is completed in an extremely short time in comparison with a test on the logic circuit 3.

Moreover, before or after testing the logic circuit 3 and memory 50 in parallel using the parallel test paths PASS1 to PASS5 shown in FIG. 4, and testing the memory 50 using the memory test paths PASS2 to PASS4, PASS6 shown in FIG. 5, the bypass circuit 40 is controlled to go into a state that enables the logic circuit test path PASS7 shown in FIG. 6, and a test on the logic circuit 3 where the third and fourth signal lines L3 and L4 are fault detection targets is executed. Since only the first signal line L1, second signal line L2, fifth to eighth signal lines L5 to L8 may be tested, the test is completed in an extremely short time in comparison with a test on the logic circuit 3.

<Second Test Method>

Next, a description will be given of an example of the test method when a test on the logic circuit 3 as shown in FIG. 1 and a test on the memory 50 including a retention test are executed in parallel.

Figure 8:
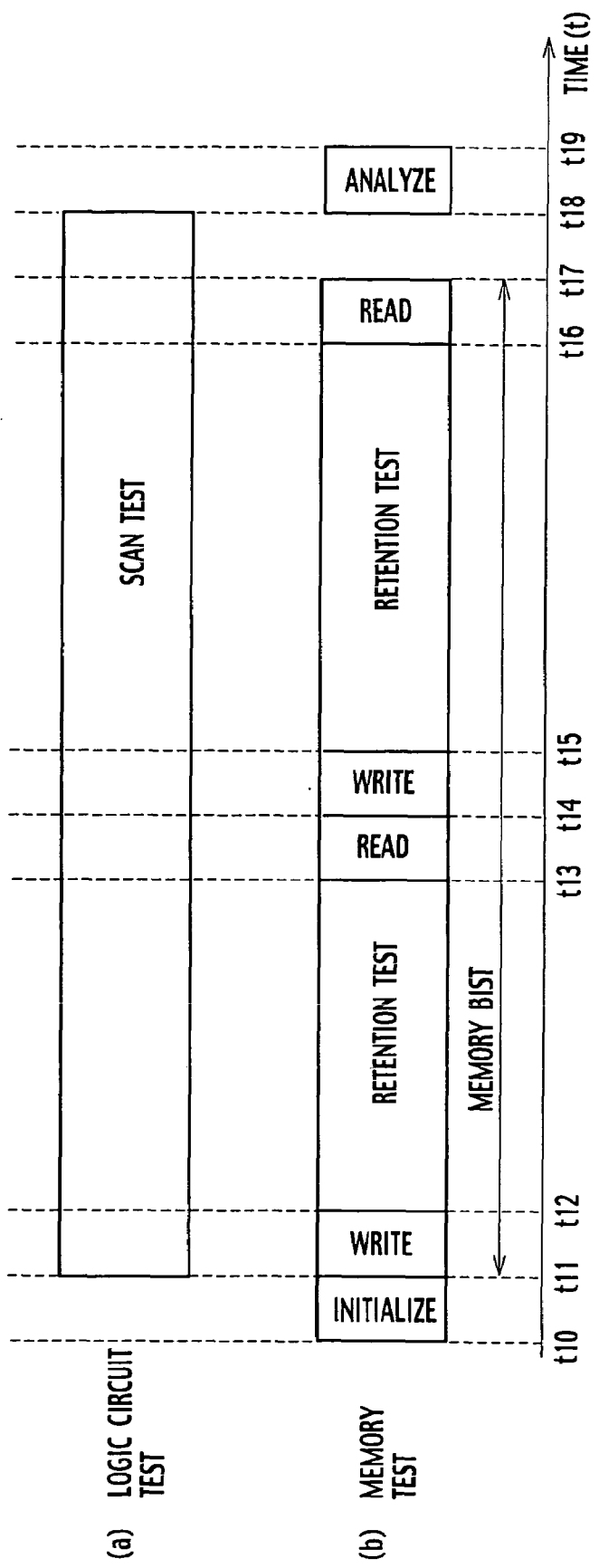
FIG. 8 is a graph for explaining an example of a method of testing the memory added retention test and testing the logic circuit in parallel according to the first embodiment of the present invention.

(a) During a period from time t10 to time t11 shown in FIG. 8, the BIST circuit 30 is initialized in a similar procedure to that during the period from time to time t1 shown in FIG. 7. At time t11, the execution of the tests on the memory 50 and on the logic circuit 3 is started. During a period from time t11 to time t12, memory write test data TD1 from the BIST circuit 30 is written to the memory 50.

(b) At time t12, the BIST circuit 30 halts its operation for the retention test and goes into an operation hold mode. At this time, a write end signal HLD is transmitted from the memory BIST control circuit 32 to the hold time counter 31. Upon receiving the write end signal HLD, the hold time counter 31 starts counting hold time. During a period from time t12 to time t13, synchronizing with an external clock CK supplied via the external clock input terminal 102, the hold time counter 31 counts hold time required for the retention test.

(c) After a lapse of the hold time necessary for the retention test, at time t13, a time lapse signal TS is transmitted from the hold time counter 31 to the memory BIST control circuit 32, and then reading from the memory 50 is started. During a period from time t13 to time t14, memory read test data TQ1 are read from all the addresses on the memory 50. At time t14, write operation to the memory 50 is started. Here, the write and read operations to the memory 50 are performed using two types of patterns: e.g., a pattern with all bits 0 and a pattern with all bits 1. Therefore, if "0" is written in all the bits on the memory 50 during the period from time t11 to time t12, "1" is written in all the bits on the memory 50 during the period from t14 to t15.

(d) At time t15, for the retention test, the BIST circuit 30 again goes to an operation hold mode. During a period from time t15 to time t16, the hold time counter 31 counts hold time necessary for the retention test in a similar way to that during the period from time t12 to time t13, in synchronization with external clocks CK from the external clock input terminal 102.

(e) After a lapse of the hold time necessary for the retention test, at time t16, a time lapse signal TS is transmitted from the hold time counter 31 to the memory BIST control circuit 32. After the retention test is terminated, in other words, the operation hold mode is quit, during a period from time t16 to time t17, memory read test data TQ1 are read from all the addresses on the memory 50. At time t17, the execution of the memory BIST is terminated. During a period from time t17 to time t18, a scan test, i.e. a scan test on the remaining portion of the logic circuit 3 is executed in a similar procedure to that during the period from time t2 to time t3 shown in FIG. 7. After the test on the logic circuit 3 is terminated at time t18, during a period from time t18 to time t19, a result of the memory BIST is determined. At time t19, the test on the memory 50 is terminated.

As described above, in the bypass circuit 40x shown in FIG. 14, the single stage multiplexers 41a to 41d and 43a are disposed on the input and outputs. Accordingly the signal lines L11 to L14 cannot be tested, resulting in a less fault coverage. Moreover, in the bypass circuit 40y shown in FIG. 15 as well, since the signal lines are overlapped, the logic circuit 3 and the memory 50 cannot be tested in parallel. On the other hand, according to the bypass circuit 40, the logic circuit 3 and the memory 50 can be tested in parallel using the parallel test paths PASS1 to PASS5 shown in FIG. 4 and, accordingly, test time can be reduced. Moreover, the first to eighth signal lines L1 to L8, which are not tested in the parallel test paths PASS1 to PASS5 shown in FIG. 4 when testing the logic circuit 3 and the memory 50 in parallel, can be tested using the memory test paths PASS2 to PASS4 and PASS6 shown in FIG. 5 and the logic circuit test path PASS7 shown in FIG. 6. Accordingly, it is possible to test all the signal lines in the bypass circuit 40 and achieve a high fault coverage.

In addition, for a method for determining the termination of the operation hold mode at times t13 and t16 shown in FIG. 8, apart from the method in which the hold time counter 31 shown in FIG. 2 counts hold time, a method may be adopted in which a self-test restart signal externally input is provided, and the termination of an operation hold mode is noticed by changing this signal. Although the termination can be determined by this method, in order to change this signal, it is necessary to modify a test pattern and a tester program in accordance with hold time. In particular, in the case of testing the logic circuit 3 and the memory 50 in parallel, it is necessary to include this signal change in a test pattern for the test on the logic 3. Therefore, when a test is executed with a changed setting of hold time, the work involved becomes very complicated. On the other hand, as for the method in which hold time is counted with the provision of a hold time counter in an LSI, if the LSI does not include the counter in advance, it is necessary to provide a new counter for the BIST. Here, since high-speed operation is often required in a memory BIST, the provision of a counter for counting time necessary for a retention test results in increased circuit area. In particular, when a plurality of memories having different configurations from one another are individually tested, each memory has a different timing for entering an operation hold mode for a BIST. Therefore, the memories cannot share a counter, resulting in still larger circuit area.

By comparison, according to the first embodiment, the hold time counter 31 shown in FIG. 2 counts hold time for a retention test in synchronization with an external clock CK, which has a slower in speed than a high-speed clock HCK transmitted from the PLL circuit 62. Therefore, the bit width of the hold time counter 31 can be reduced, and accordingly, the entire circuit area can be reduced. As a result, the complicated work such as the modification of a test pattern or tester program in accordance with hold time in order to change a signal for determining the termination of an operation hold mode in unnecessary. In particular, when testing the logic circuit 3 and the memory 50 in parallel, it is unnecessary to include this signal change in a test pattern for testing the logic circuit 3. Accordingly, work is facilitated to a great degree particularly when a test is executed with changed setting of hold time.

(Modification)

Figure 9:
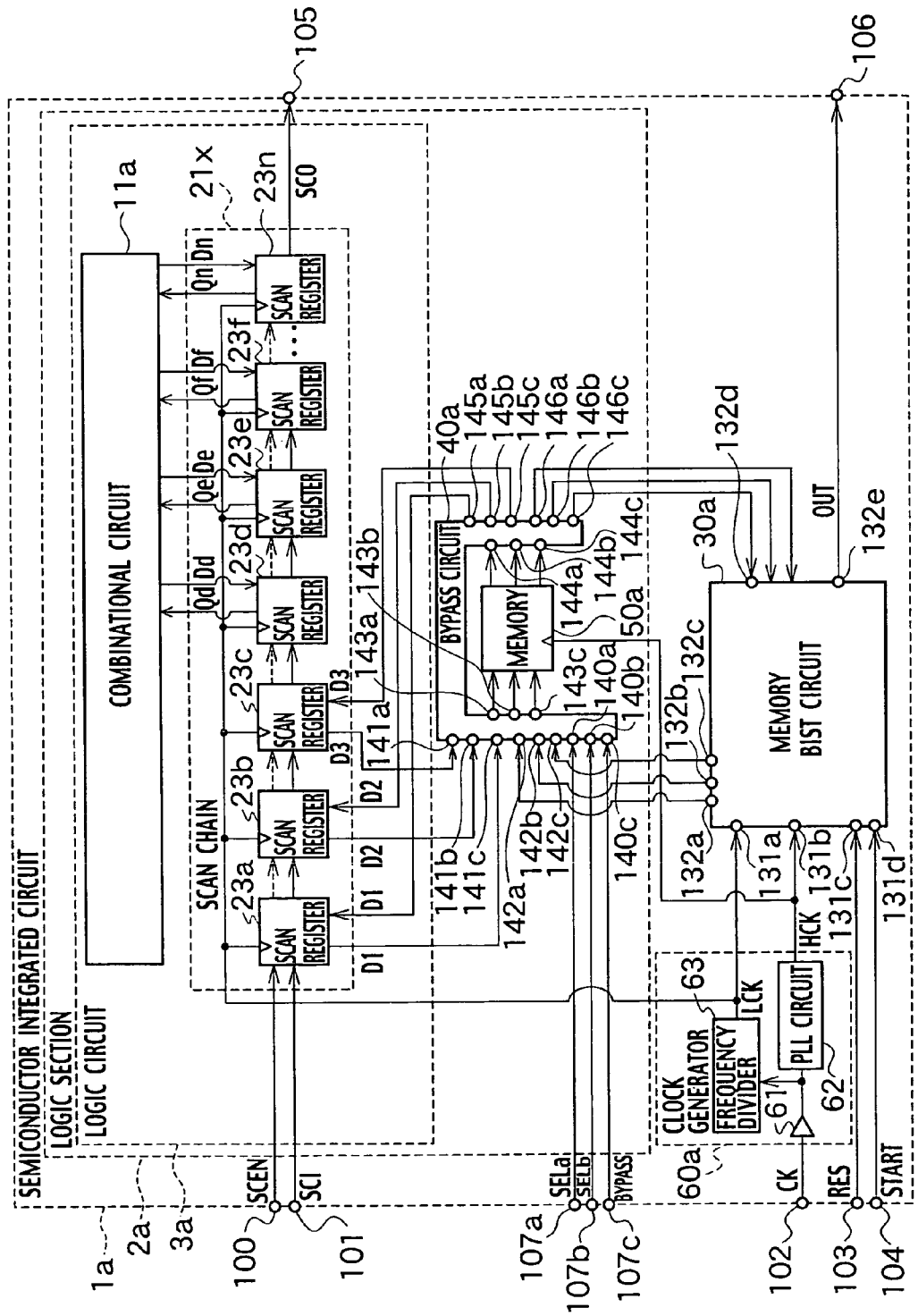
FIG. 9 is a circuit diagram showing an example of a semiconductor integrated circuit according to a modification of the first embodiment of the present invention.

As shown in FIG. 9, a semiconductor integrated circuit 1a according to a modification of first embodiment of the present invention includes a logic section 2a to be tested, a clock generator 60a, and a BIST circuit 30a. The clock generator 60a further includes a frequency divider 63 connected between the buffer 61, the logic section 2a and the BIST circuit 30a. The clock generator 60a is different in this point from the clock generator 60 shown in FIG. 1. The frequency divider 63 devides an external clock CK, and generates a low-speed clock LCK, which is slower than the external clock CK.

The logic section 2a shown in FIG. 9 includes a logic circuit 3a, a bypass circuit 40a connected with the logic circuit 3a, and a memory 50a connected with the bypass circuit 40a. The logic circuit 3a includes a scan chain 21x, and a combinational circuit 11a connected with the scan chain 21x. The scan chain 21x includes a plurality of scan registers 23a, 23b, 23c, 23d, 23e, 23f, . . . , 23n respectively connected with the frequency divider 63, and connected with each other in series. The scan registers 23a, 23b, 23c are connected with the system input terminals 141a to 141c of the bypass circuit 40a. The scan registers 23a, 23b, 23c are different in this point from the scan registers 21a to 21c, which are connected with the combinational circuit 11a shown in FIG. 1. The memory 50a has a plurality of output terminals. The memory 50a is different in this point from the memory 50 shown in FIG. 1. Note that, the memory 50a is described schematically, and actually, the memory 50 has a large number of input and output terminals.

The bypass circuit 40a includes: system input terminals 141a to 141c and system output terminals 145a to 145c connected with the scan registers 23a to 23c; test input terminals 142a to 142c and test output terminals 146a to 146c connected with the BIST circuit 30a; output terminals 143a to 143c and input terminals 144a to 144c connected with the memory 50a.

Figure 10:
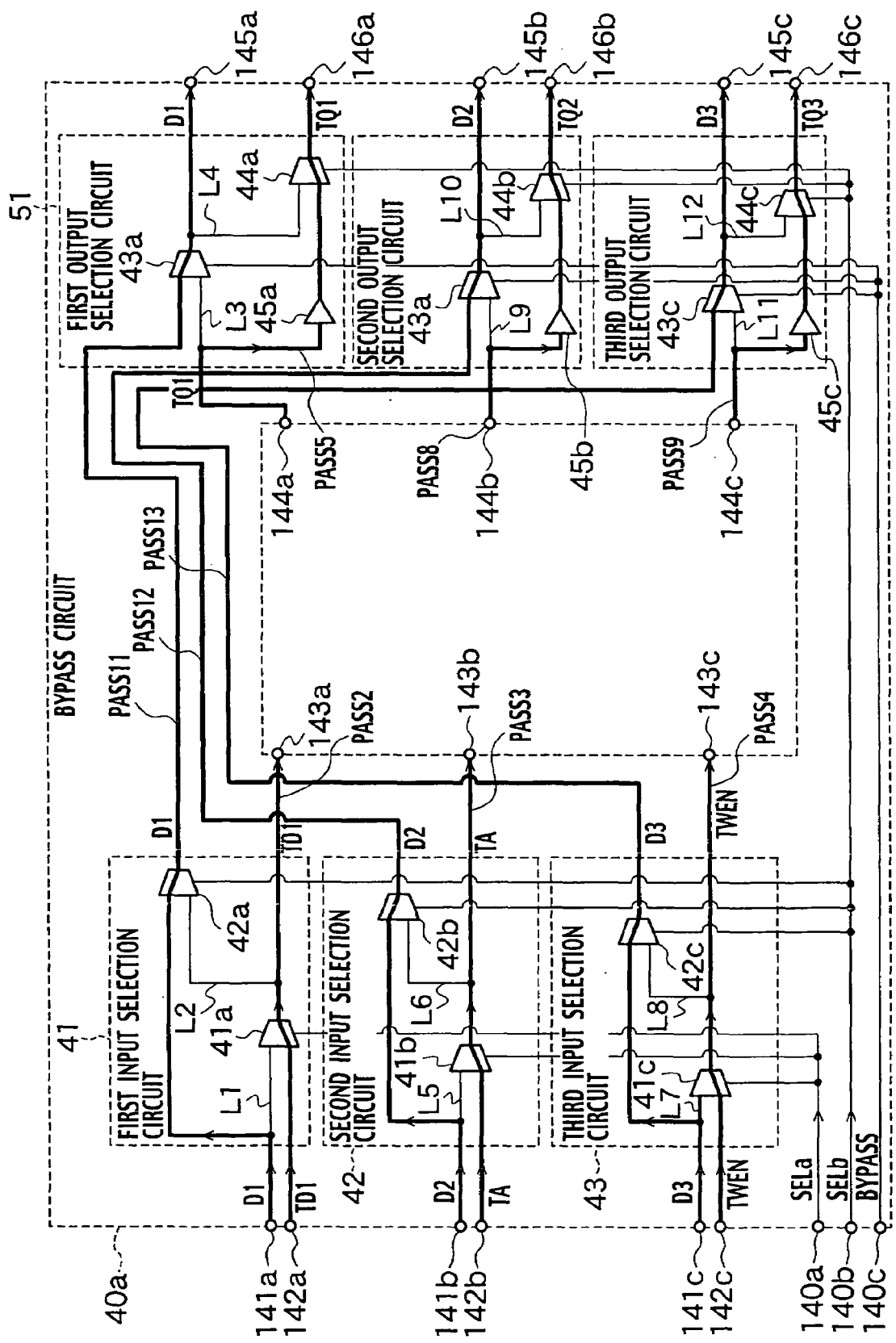
FIG. 10 is a circuit diagram showing an example of a bypass circuit according to the modification of the first embodiment of the present invention.

As shown in FIG. 10, the bypass circuit 40a includes first to third input selection circuits 41 to 43, and first to third output selection circuits 51 to 53 respectively connected with the first to third input selection circuits 41 to 43. The first output selection circuit 51 includes a first output pre-multiplexer 43a, a first output post-multiplexer 44a and a buffer 45a. The input of the first output pre-multiplexer 43a is connected with the input terminal 144a and the first input post-multiplexer 42a and the output thereof is connected with the system output terminal 145a. The input of the first output post-multiplexer 44a is connected with the first output pre-multiplexer 43a and the input terminal 144a and the output thereof is connected with the test output terminal 146a. The buffer 45a is connected between the input terminal 144a and the first output post-multiplexer 44a.

The second output selection circuit 52 includes second output pre-multiplexer 43b, a second output post-multiplexer 44b and a buffer 45b. The input of the second output pre-multiplexer 43b is connected with the input terminal 144b and the second input post-multiplexer 42b and the output thereof is connected with the system output terminal 145a. The input of the second output post-multiplexer 44b is connected with the second output pre-multiplexer 43b and the input terminal 144b and the output thereof is connected with the test output terminal 146b. The buffer 45b is connected between the input terminal 144b and the second output post-multiplexer 44b.

The third output selection circuit 53 includes a third output pre-multiplexer 43c, a third output post-multiplexer 44c and a buffer 45c. The input of the third output pre-multiplexer 43c is connected with the input terminal 144c and the third input post-multiplexer 42c, and the output thereof is connected with the system output terminal 145c. The input of the third output post-multiplexer 44c is connected with the third output pre-multiplexer 43c and the input terminal 144c, and the output thereof is connected with the test output terminal 146c. The buffer 45c is connected with the input terminal 144c and the third output post-multiplexer 44c.

Each of the first to third output pre-multiplexers 43a, 43b and 43c is controlled by the bypass selection control signals BYPASS, transmitted from the common input terminal 140c, and switches propagating signals. Each of the first to third output post-multiplexers 44a to 44c is controlled by the selection control signals SELb transmitted from the common input terminal 140b.

In the modification of the first embodiment as well, the memory 50a and the logic circuit 3a are also tested in parallel. The bypass circuit 40a is controlled to go into a state that enables parallel test paths PASS2 to PASS5, PASS8, PASS9, and PASS11 to PASS13, as indicated by the bold lined in FIG. 10. Memory write test data TD1, an address signal TA, and a memory control signal TWEN are transmitted from the first to third input selection circuits 41 to 42 to the memory 50a via the output terminals 143a to 143c, respectively. The memory write test data TD1 is thus written to the memory 50a. Thereafter, memory read test data TQ1 to TQ3 are transmitted from the memory 50a to the first to third output selection circuits 51 to 53 via the input terminals 144a to 144c, respectively. The memory read test data TQ1 to TQ3 are then transmitted from the first to third output selection circuits 51 to 53 to a result analyzer in the BIST circuit 30a shown in FIG. 9 via the output terminals 146a to 146c, respectively.

For a scan test, the scan registers 23a to 23n in the scan chain 21x shift scan data SCI in synchronization with low-speed clocks LCK. Logic circuit test data D1 to D3 are transmitted from the scan registers 23a to 23c, respectively, to the bypass circuit 40a. In the bypass circuit 40a, as shown in FIG. 10, the logic circuit test data D1 to D3 are transmitted from the first to third input selection circuits 41 to 43 to the output selection circuits 51 to 53, respectively. Then, from the first to third output selection circuits 51 to 53, the logic circuit test data D1 to D3 are received in the scan registers 23a to 23d shown in FIG. 9, respectively, as test result data. Moreover, logic circuit test data Qd to Qn are incorporated into the combinational circuit 1a from the scan registers 23d to 23n, respectively. The combinational circuit 11a also receives test data via input terminals from an external tester. The output state of the output terminals of the combinational circuit 11a is determined by the test data and the input states of the input terminals of the combinational circuit 11a. The output states of the output terminals of the combinational circuit 11a are observed by an external tester. After testing the combinational circuit 11a, test result data Dd to Dn are received in the scan registers 23d to 23n respectively, when the scan registers 23d to 23n receives the external clock CK. The scan registers 23d to 23n shifts the logic circuit test data D1 to D3 and the test result data Dd to Dn in serial. The shifted logic circuit test data D1 to D3 and test result data Dd to Dn are transmitted as scan result data SCO to the scan result data output terminal 105, and observed by an external tester.

In addition, when testing the memory 50a, including a retention test, by using the BIST circuit 30a, a hold time counter similar to the hold time counter 31 shown in FIG. 2 operates in synchronization with low-speed clocks LCK transmitted from the frequency divider circuit 63. For the result analyzer in the BIST circuit 30a, for example, a compactor-based analyzer can be employed which receives in parallel the memory read test data TQ1 to TQ3 transmitted via the output terminals 146a to 146c and then compacts the data as a few bit data. The compacted data is read from a signal OUT.

According to the modification of the first embodiment, when using the bypass circuit 40a shown as FIG. 10, it is also possible to test the logic circuit 3a and the memory 50a in parallel. It is also possible to test the first to twelfth signal lines L1 to L12 when testing the logic circuit 3a and the memory 50a, therefore it is possible to obtain a high fault coverage.

Further, when the hold time counter counts hold time for a retention test in synchronization with low-speed clocks LCK, even though the circuit area of the frequency divider circuit 63 are increased, the bit width of the hold time counter can be reduced, and accordingly the entire circuit area can be reduced. In particular, when the semiconductor integrated circuit 1a is provided with a plurality of memories and BIST circuits apart from the memory 50a and the BIST circuit 30a, it is possible to reduce the number of bits if hold time counters in the plurality of BIST circuits share the frequency divider circuit 63 and, thus, to further reduce the circuit area.

SECOND EMBODIMENT

Figure 11:
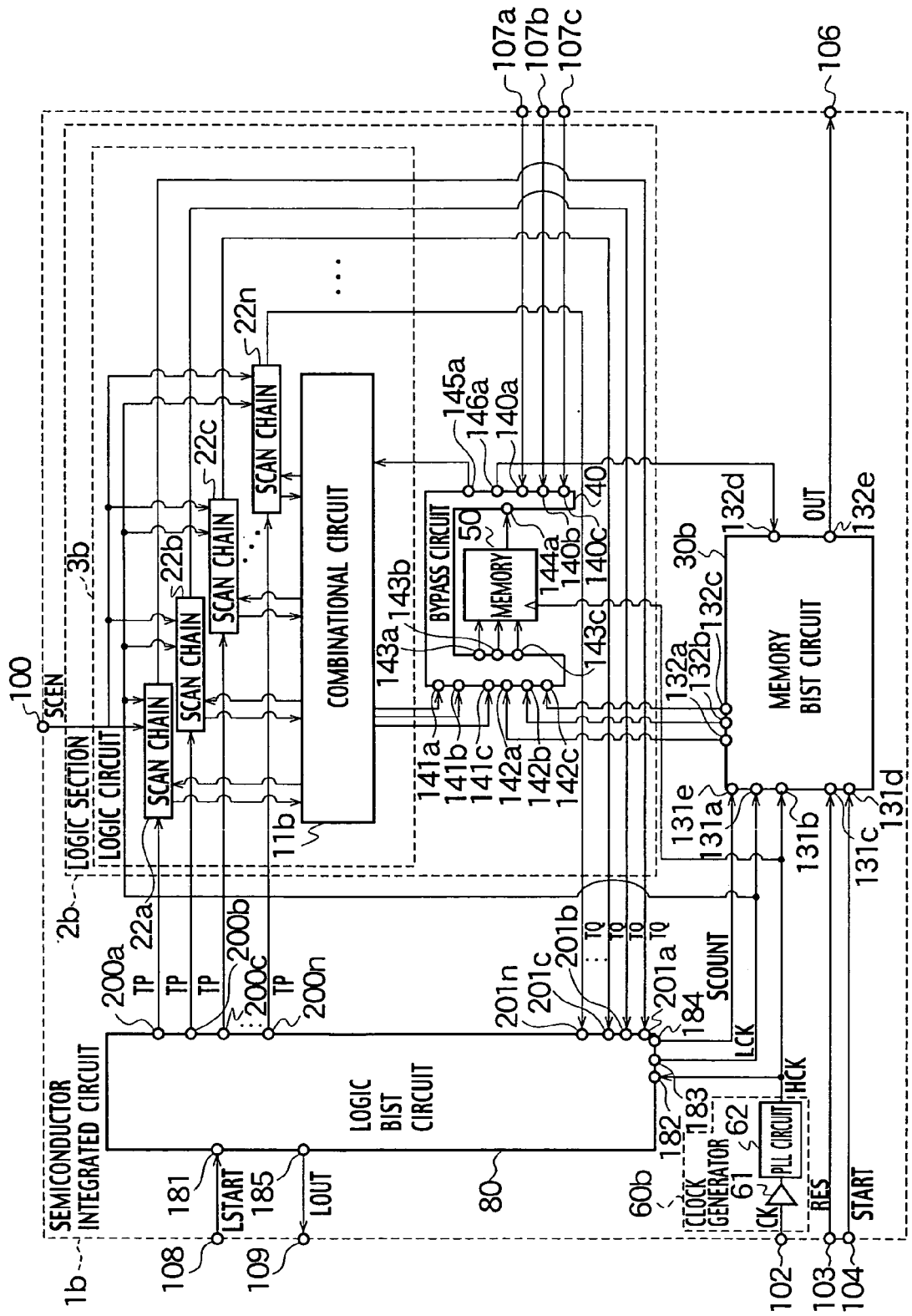
FIG. 11 is a circuit diagram showing an example of a semiconductor integrated circuit according to a second embodiment of the present invention.

As shown in FIG. 11, a semiconductor integrated circuit 1b according to a second embodiment of the present invention includes a clock generator 60b, a logic BIST circuit 80 connected with the clock generator 60b, a logic section 2b connected with the clock generator 60b and the logic BIST circuit 80, and a BIST circuit (memory BIST circuit) 30b connected with the clock generator 60b, the logic BIST circuit 80 and the logic section 2b.

The clock generator 60b includes a buffer 61 connected with an external clock input terminal 102 and a PLL circuit 62 connected with the buffer 61. The buffer 61 buffers the external clock CK. The PLL circuit 62 multiplies frequency of the external clock CK, and generates a high-speed clock HCK.

For example, a so-called circuit "STUMPS (Self-Testing Using MISR and Parallel SRSGs)" can be used as the logic BIST circuit 80. The logic BIST circuit 80 includes an input terminal 181 connected with a logic test start signal input terminal 108, an output terminal 185 connected with a compression signal output terminal 109, an input terminal 182 connected with the clock generator 60b, an output terminals 183, 184 connected with the BIST circuit 30b, a plurality (first to nth) of output terminals 200a, 200b, 200*c*, ..., 200*n* and a plurality (first to nth) of input terminals 201*a*, 201*b*, 201*c*, ..., 201*n* respectively connected with the logic section 2.

Figure 12:
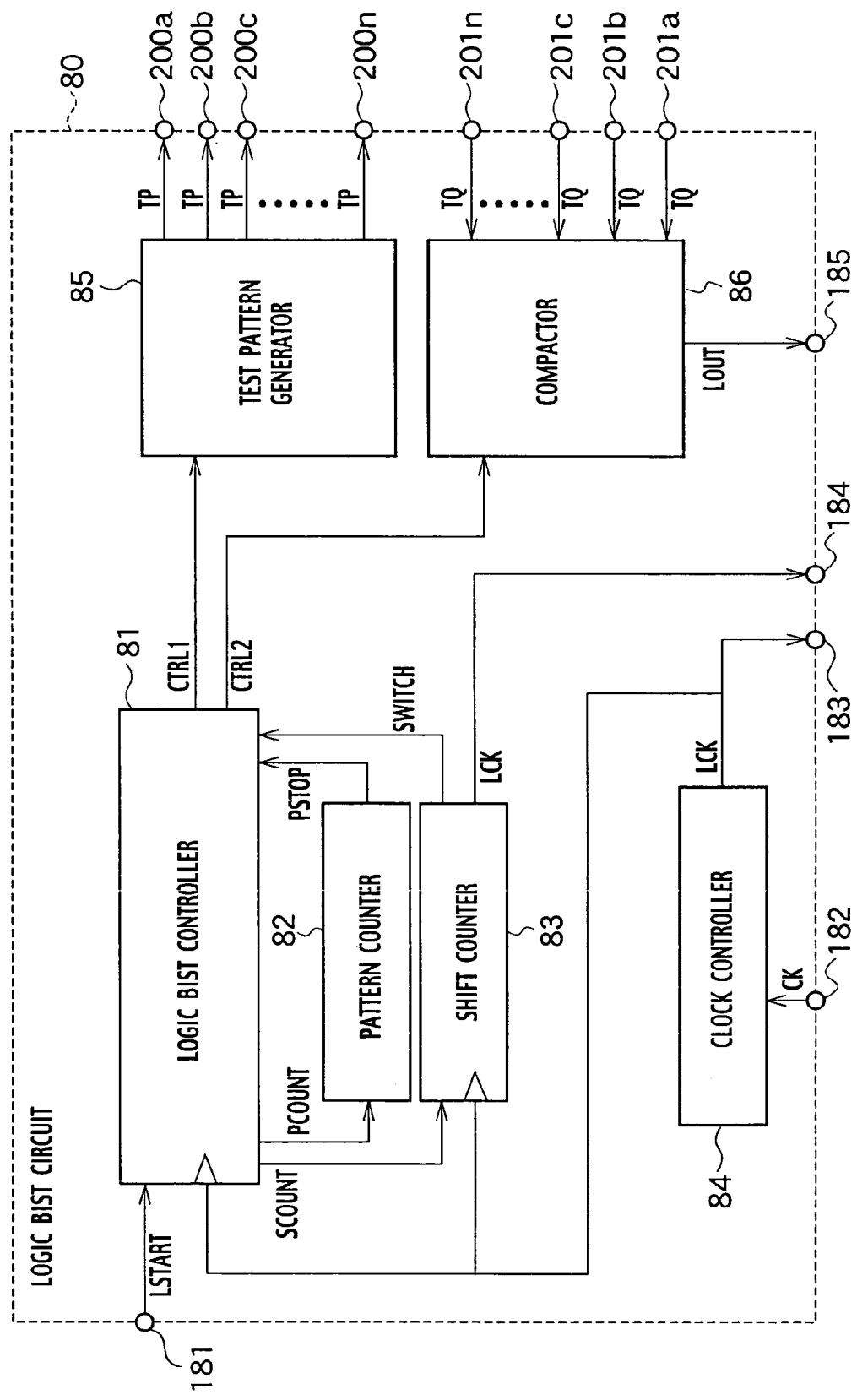
FIG. 12 is a circuit diagram showing an example of an logic BIST circuit according to the second embodiment of the present invention.

As shown in FIG. 12, the logic BIST circuit 80 includes a logic BIST controller 81 connected with the input terminal 181, a test pattern generator 85 connected with the logic BIST controller 81 and the plurality (first to nth) of output terminals 200*a*, 200*b*, 200*c*, ..., 200*n*, a compactor 86 connected with the logic BIST controller 81, the plurality (first to nth) of input terminals 201*a*, 201*b*, 201*c*, ..., 201*n* and the output terminal 185, a shift counter 83 connected with the logic BIST controller 81 and the output terminal 183, a pattern counter 82 connected with the logic BIST controller 81, and a clock controller 84 connected with the input terminal 182 and the output terminal 183.

Upon receiving a logic test start signal LSTART for starting a test on the logic circuit 3*b*, transmitted from an external tester via the input terminal 181, the logic BIST control circuit 82 generates logic test control signals CTRL1 and CTRL2 and transmits the logic test control signals CTRL1 and CTRL2 to the test pattern generator 85 and the compactor 86, respectively. The clock control circuit 84 divides a high-speed clock HCK from the PLL circuit 62 shown in FIG. 11, thereby generating a low-speed clock LCK.

For the test pattern generator 85 shown in FIG. 12, for example, a single-input signature register (SISR), a pseudo-random pattern generator (PRPG) such as a linear feedback signature register (LFSR), or the like can be employed. In response to the logic test control signal CTRL1, the test pattern generator 85 sequentially generates pseudo-random test patterns (logic circuit test data) TP. The generated test patterns TP are transmitted in parallel to scan chains 22*a* to 22*n* in the logic circuit 3*b* shown in FIG. 11.

For the compactor 86 shown in FIG. 12, for example, a multiple-input signature register (MISR) can by employed. The compactor 86 sequentially receives parallel test result patterns TQ transmitted from the scan chains 22*a* to 22*n* and compacts the patterns. Further, the compactor 86 transmits a compacted signal LOUT in a final compacted state, to an external tester. The compacted signal LOUT is compared by the external tester with an expected value in the tester. Thus, a fault if prevent, is detected.

The shift counter 83 shown in FIG. 12, in synchronization with external clocks CK, counts the number of the shift operations of the scan chains 22*a* to 22*n* shown in FIG. 11. When it is determined that it is time to switch to the operation of receiving test result patterns TQ, the shift counter 83 transmits a switching signal SWITCH to the logic control circuit 81.

The pattern counter 82, upon receiving a count signal PCOUNT transmitted from the logic BIST control circuit 81, counts the number of repeats of the shift operation and the receiving operation. When the pattern counter 82 has counted a number that can yield a satisfactory fault coverage, the pattern counter 82 transmits a stop signal PSTOP to the logic BIST control circuit 81.

The logic section 2*b* shown in FIG. 11 includes: the scan chains 22*a* to 22*n* the respective inputs of which are connected with the output terminals 200*a* to 200*n* of the logic BIST circuit 80 respectively, and the respective output of which are connected with the input terminals 201*a* to 201*n* of the logic BIST circuit 80 respectively; a combinational circuit 11*b* connected with the scan chains 22*a* to 22*n*; a bypass circuit 40 of which system input terminals 141*a* to 141*c* and an system output terminal 145*a* are connected with the combinational circuit 11*b*; and a memory 50 connected with output terminals 143*a* to 143*c* and an input terminal 144*a* of the bypass circuit 40.

Similar to the scan chain 21 shown in FIG. 1, each of the scan chains 22*a* to 22*n* has a plurality of scan registers, connected in series with each other, which are obtained in advance by converting registers for use in normal operation. In comparison with the scan design technique used for the scan chain 21 shown in FIG. 1 which is connected with the input and output terminals 101 and 105, a technique used for the scan chains 22*a* to 22*n* shown in FIG. 12 is different in that the input of the first-stage scan resister and the output of the last-stage scan register in each scan chain are connected with the logic BIST circuit 80.

The plurality of scan registers in the scan chains 22*a* to 22*n*, in synchronization with low-speed clocks LCK, sequentially shift the test patterns TP to the next-stage scan registers, and a value is set in each register. Moreover, the scan chains 22*a* to 22*n*, individually, also enable the combination circuit 11*b* to incorporate the test patterns TP. The test patterns TP transmitted from the combinational circuit 11*b* to the system input terminals 141*a* to 141*c* of the bypass circuit 40 are enabled to pass through the bypass circuit 40 to bypass the memory 50 and are then transmitted to the combinational circuit 11*b* from the system output terminal 145*a*. The scan registers in the scan chains 22*a* to 22*n* receive in respective test result patterns TQ transmitted from the combinational circuit 11*b* in accordance with the respective test patterns TP. Again, values in the scan registers in the scan chains 22*a* to 22*n* are sequentially shifted, and the test result patterns TQ are transmitted in parallel from the last-stage scan registers to the compactor 86.

Figure 13:
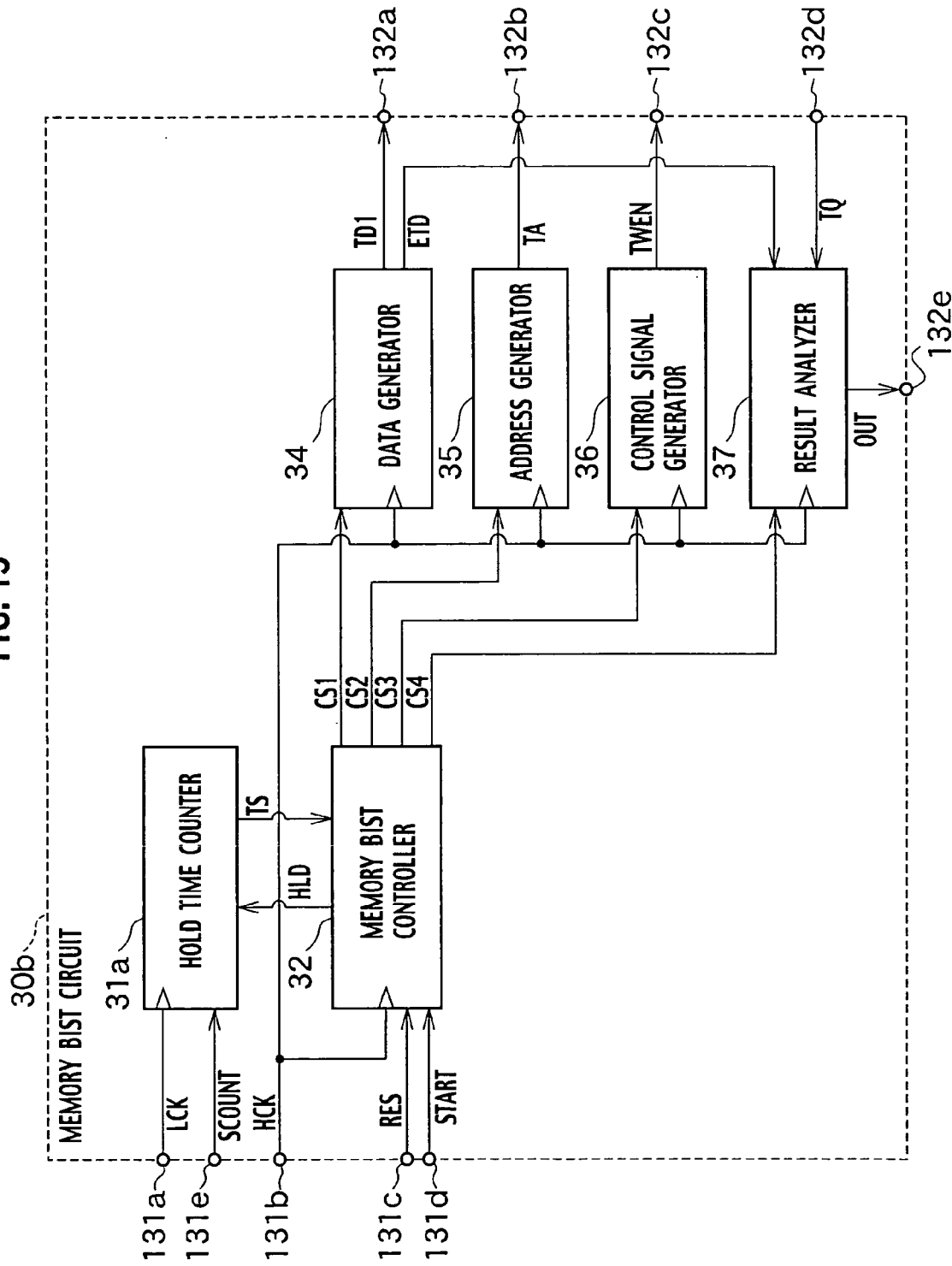
FIG. 13 is a circuit diagram showing an example of a BIST circuit according to the second embodiment of the present invention.

The BIST circuit 30*b* shown in FIG. 11 has input terminals 131*b*, 131*a* and 131*e* connected with the PLL circuit 62 and the output terminals 183 and 184 of the logic BIST circuit 80, respectively. In the BIST circuit 30*b*, a hold time counter 31*a* shown in FIG. 13 is different from the hold time counter 31 shown in FIG. 2 in that the hold time counter 31*a* is further connected with the input terminal 131*e*. That is, the hold time counter 31*a* counts hold time required for a retention test in synchronization with low-speed clocks LCK transmitted from the clock control circuit 84. When a signal that recognizes a most significant bit or maximum count value from the shift counter 83 shown in FIG. 12 is transmitted to the hold time counter 31*a*, the hold time counter 31*a* transmits a time lapse signal TS to the memory BIST control circuit 32. The other configuration of the BIST circuit 30*b* is similar to that of the BIST circuit 30 shown in FIG. 2, and a redundant description will be omitted.

In a test method according to the second embodiment of the present invention, similar to that of the first embodiment of the present invention, the memory 50 and the logic circuit 3*b* are tested in parallel. A test on the memory 50 using the BIST circuit 30 is executed in a similar way to the test method using the BIST circuit 30 shown in FIGS. 1 and 2, and a redundant description will be omitted.

On the other hand, as for a test on the logic circuit 3*b*, a logic BIST using the logic BIST circuit 80 is executed instead of the scan test. In the logic BIST, procedures, by the scan registers, of shifting test patterns TP generated by the test pattern generator 85, receiving test result patterns TQ, shifting the received test result patterns TQ, and, compacting the rest result patterns TQ, are repeated until a satisfactory fault coverage is achieved. The BIST circuit 30*a* and the logic BIST circuit 80 can carry out respective tests only with the provision of clocks. Therefore, the execution of a retention test does not affect the capability of the parallel tests. Note that, similar to the first embodiment, signal lines which are not tested in the parallel test paths when the memory 50 and the logic circuit 3a are tested, by switching to the state that enables memory test paths and logic circuit test paths respectively.

According to the second embodiment, similar to the first embodiment, it is possible to test the logic circuit 3a and memory 50 in parallel, and thus it is possible to reduce time for testing the logic section 2b. Furthermore, it is possible to test all signal lines in the bypass circuit 40a, and thus it is possible to achieve a high fault coverage.

Moreover, since the hold time counter 31a shown in FIG. 13 can use the shift counter 83 as a less significant bit, the number of bits can be reduced, and therefore the circuit area can be reduced. In particular, when testing a plurality of memories having different configurations from one another by using a plurality of respective BIST circuits, since the timings to enter an operation hold mode are different depending on the BIST circuits, it is necessary to provide a plurality of individual hold time counters for the plurality of memories. However, since the shift counter 83 can be used as a less significant bit, it is possible to reduce the number of bits of each hold time counter and therefore to further reduce the circuit area.

OTHER EMBODIMENT

In the first and second embodiments of the present invention, although the single memory 50 is shown, the number of memories and the types thereof are not particularly limited. For example, a semiconductor integrated circuit may have a plurality of memories having a similar configuration to that of the memory 50, or may have a plurality of memories having different configurations from that of the memory 50. When a semiconductor integrated circuit has a plurality of memories, a bypass circuit could be provided for each of the plurality of memories. Moreover, a BIST circuit could be provided for each of the plurality of memories. In addition, the number of signal lines of the BIST circuit 30 and the bypass circuit 40 can be increased or reduced depending on the number of memories. The BIST circuit 30 may test a plurality of memories.

The memory 50 shown in FIG. 5 receives a plurality of (first to n-th) inputs in practice. Therefore, in addition to the first to third input selection circuits 41 to 43 that deal with the first to third inputs respectively, the bypass circuit 40 could include fourth to n-th input selection circuits that deal with the fourth to n-th inputs respectively. Moreover, when the memory provides a plurality of (first to m-th) outputs, in addition to the first output selection circuit 51 that deals with the first output, the bypass circuit 40 could further include second to m-th output selection circuits that deal with the second to m-th outputs respectively. As for the number of inputs to the exclusive-OR gate 52a, it is possible to select a suitable number depending on the number of the first to n-th input selection circuits or the like.

Further, a "compactor-based" BIST circuit may be employed in place of the "comparator-based" BIST circuit 30 which compares memory read test data TQ1 read from the memory 50 with an expected value ETD generated in the BIST circuit 30. In the compactor-based BIST circuit, memory read test data TQ1 are sequentially compacted by a compactor, and a final compacted result is compared with an expected value which is calculated beforehand. Moreover, although the scan test and the logic BIST have been shown as a test on the logic circuit 3, the type of the test is not particularly limited.

Furthermore, a BIST circuit without the hold time counter 31 or 31a, that is, a BIST circuit with no retention test function may be employed in place with the BIST circuit 30 having the hold time counter 31 or 31a.

Various modifications will become possible for those skilled in the art after receiving the teachings of the present disclosure without departing from the scope thereof.

What is claimed is:

1. A semiconductor integrated circuit comprising:
    a logic circuit to be tested;
    a memory connected to the logic circuit to be tested;
    a built-in self test circuit for testing the memory; and
    a bypass circuit connected between the memory and the logic circuit and between the memory and the built-in self test circuit, the bypass circuit has a parallel test path for testing the logic circuit and the memory in parallel so as to separate the memory from the test path for testing the logic circuit, and a signal line test path for testing non-tested signal lines in the parallel test path, and the bypass circuit selectively switches the parallel test path and the signal line test path.

2. The semiconductor integrated circuit of claim 1, wherein the bypass circuit further comprises:
    a first input pre-multiplexer, the input of which is connected with the built-in self test circuit and the logic circuit, and the output of which is connected with the memory;
    a first input post-multiplexer, the input of which is connected with the logic circuit and the first input pre-multiplexer;
    a first output pre-multiplexer, the input of which is connected with the memory and the first input post-multiplexer, and the output of which is connected with the logic circuit; and
    a first output post-multiplexer, the input of which is connected with the first output pre-multiplexer and the memory, and the output of which is connected with the built-in self test circuit.

3. The semiconductor integrated circuit of claim 2, wherein:
    the first input pre-multiplexer selects memory write test data transmitted from the built-in self test circuit for testing on the memory;
    the first input post-multiplexer selects the logic circuit test data for testing the logic circuit transmitted from the logic circuit;
    the first output pre-multiplexer selects the logic circuit test data selected by the first input post-multiplexer and transmits the logic circuit test data to the logic circuit; and
    the first output post-multiplexer selects memory read test data read from the memory in response to the memory write test data, and transmits the memory read test data to the built-in self test circuit.

4. The semiconductor integrated circuit of claim 2, wherein the non-tested signal line includes:
    a first line between the logic circuit and the first input pre-multiplexer;
    a second line between the first input pre-multiplexer and the first input post-multiplexer;
    a third line between the memory and the first output pre-multiplexer; and
    a fourth line between the first output pre-multiplexer and the first output post-multiplexer.

5. The semiconductor integrated circuit of claim 2, wherein:

the first input pre-multiplexer selects memory write test data transmitted from the built-in self test circuit for testing the memory and transmit the memory write test data to the memory;

the first output pre-multiplexer selects memory read data read from the memory in response to the memory write test data; and the first output post-multiplexer selects the memory read data selected by the first output pre-multiplexer and transmit the memory read data to the built-in self test circuit.

6. The semiconductor integrated circuit of claim 2, wherein the first input pre-multiplexer selects the logic circuit test data for testing the logic circuit transmitted from the logic circuit;

the first input post-multiplexer selects the logic circuit test data selected by the first input pre-multiplexer; and the first output pre-multiplexer selects the logic circuit test data selected by the first input post-multiplexer and transmits the logic circuit test data to the logic circuit.

7. The semiconductor integrated circuit & claim 2, wherein the bypass circuit further comprises:

a second input pre-multiplexer, the input of which is connected with the built-in self test circuit and the logic circuit, and the output of which is connected with the memory;

a second input post-multiplexer, the input of which is connected with the logic circuit and the second input pre-multiplexer; and an exclusive-OR gate connected between the first input post-multiplexer and the second input post-multiplexer, and the first output pre-multiplexer.

8. The semiconductor integrated circuit of claim 2, wherein the bypass circuit further comprises:

a second input pre-multiplexer, the input of which is connected with the built-in self test circuit and the logic circuit, and the output of which is connected with the memory;

a second input post-multiplexer, the input of which is connected with the logic circuit and the second input pre-multiplexer;

a second output pre-multiplexer, the input of which is connected with the memory and the second input post-multiplexer, and the output of which is connected with the logic circuit; and a second output post-multiplexer, the input of which is connected with the second output pre-multiplexer and the memory, and the output of which is connected with the built-in self test circuit.

9. The semiconductor integrated circuit of claim 1, further comprising a PLL circuit multiplies frequency of the external clock for testing the logic circuit, generating a high-speed clock faster than an external clock, and transmitting the high-speed clock to the memory.

10. The semiconductor integrated circuit of claim 1, further comprising a hold time counter synchronizing an external dock for testing the logic circuit, and counting hold time for test of the memory.

11. The semiconductor integrated circuit of claim 1, further comprising a frequency divider dividing the external clock land generating a low-speed clock slower than an external clock for testing the logic circuit.

12. The semiconductor integrated circuit of claim 11, further comprising a hold time counter synchronizing the low-speed clock, and counting hold time for retention test of the memory.

13. The semiconductor integrated circuit of claim 1, further comprising a logic built-in self test circuit connected to the logic circuit for testing the logic circuit.

14. The semiconductor integrated circuit of claim 13, wherein the logic built-in self test circuit comprises:

a test pattern generator generating a test pattern for testing the logic circuit, and transmitting the test pattern to the logic circuit; and a compactor generating compression signals one after another for compacting test result data in response to the test pattern transmitted from the logic circuit.

15. The semiconductor integrated circuit of claim 14, further comprising a hold time counter counting hold time for testing the memory.

16. The semiconductor integrated circuit of claim 15, wherein the logic built-in self test circuit further comprises a shift counter counting the number of shifts of the test pattern, and sharing at least part of bits with the hold time counter.

17. The semiconductor integrated circuit of claim 15, wherein the logic built-in self test circuit further comprises a pattern counter counting a repeating number of shifts of the test pattern and received by the compactor, and sharing at least part of bits with the hold time counter.

18. The semiconductor integrated circuit of claim 14, further comprising a PLL circuit generating a high-speed clock faster than an external clock by multiplies frequency of the external clock, and transmitting the high-speed clock to the memory.

19. The semiconductor integrated circuit of claim 18, wherein the logic built-in self test circuit further comprises a clock controller converting the high-speed clock into a low-speed clock, and transmitting the low-speed clock to the logic circuit.

20. The semiconductor integrated circuit of claim 19, further comprising a hold time counter synchronizing the low-speed clock and counting hold time for testing the memory.

* * * * *